US007565631B1

(12) United States Patent
Banerjee et al.

(10) Patent No.: US 7,565,631 B1
(45) Date of Patent: Jul. 21, 2009

(54) METHOD AND SYSTEM FOR TRANSLATING SOFTWARE BINARIES AND ASSEMBLY CODE ONTO HARDWARE

(75) Inventors: Prith Banerjee, Glenview, IL (US); Gaurav Mittal, Evanston, IL (US); David Zaretsky, Chicago, IL (US); Xiaoyong Tang, Evanston, IL (US)

(73) Assignee: Northwestern University, Evanston, IL (US)

( * ) Notice: Subject to any disclaimer, the term of this patent is extended or adjusted under 35 U.S.C. 154(b) by 972 days.

(21) Appl. No.: 10/884,589

(22) Filed: Jul. 2, 2004

(51) Int. Cl.
  *G06F 17/50* (2006.01)
(52) U.S. Cl. .................................... 716/3; 716/1; 716/2
(58) Field of Classification Search ............... 716/1, 716/2, 3
  See application file for complete search history.

(56) References Cited

U.S. PATENT DOCUMENTS

| | | | |
|---|---|---|---|
| 5,491,640 A * | 2/1996 | Sharma et al. ................. | 716/18 |
| 5,502,645 A * | 3/1996 | Guerra et al. ................. | 716/18 |
| 5,572,436 A * | 11/1996 | Dangelo et al. ............... | 716/18 |
| 6,226,776 B1 | 5/2001 | Panchul et al. | |
| 6,324,678 B1 * | 11/2001 | Dangelo et al. ............... | 716/18 |
| 6,353,920 B1 | 3/2002 | Wittig et al. | |
| 6,564,358 B2 | 5/2003 | Moondanos et al. | |
| 6,604,232 B2 * | 8/2003 | Okada et al. ................... | 716/18 |
| 6,795,963 B1 * | 9/2004 | Andersen et al. ............. | 717/130 |
| 2001/0016936 A1 * | 8/2001 | Okada et al. ................... | 716/18 |

OTHER PUBLICATIONS

Postula, A., Abramson, D., Fang, Z., Logothetis, P. A Comparison of High Level Synthesis and Register Transfer Level Design Techniques for Custom Computing Machines. Contributions made by colleagues at the University of Queensland; project supported by the Australian Research Council, no date.

Mittal, G., Zaretsky, D., Tang, X., Banerjee, P. Automatic Translation of Software Binaries onto FPGas. Northwestern University, Dec. 1, 2003.

Ramsey, N., Fernandez, M.F. Specifying Representations of Machine Instructions. ACM Transactions on Programming Languages and Systems, May 1997.

(Continued)

*Primary Examiner*—Sun J Lin
(74) *Attorney, Agent, or Firm*—Reinhart Boerner Van Deuren s.c.

(57) ABSTRACT

A computer-aided hardware design system enables design of an actual hardware implementation for a digital circuit using a software implementation of an algorithm in assembly language or machine binary code by converting an algorithmic representation for a hardware design initially created in software assembly or machine binary code of a general-purpose processor, to a hardware design implementation (FPGA or ASIC) by translating software binaries or assembly code, targeted for general-purpose processors, into RTL VHDL or Verilog code to be synthesized using commercial logic synthesis and physical design tools onto FPGAs and ASICs. The system performs data flow, parallelism analysis and optimizations at the assembly and machine code level and alias analysis to analyze memory accesses and automatically identify the parallelism in the operations automatically identifying loops and other control constructs, and recognizing procedure and function calls. The system automatically generates test benches for verifying correctness of the designs.

30 Claims, 23 Drawing Sheets

Overview of the proposed FREEDOM compiler infrastructure

OTHER PUBLICATIONS

Cifuentes, C., Gough, K.J. A Methodology for Decompilation. XIX Conferencia Latinoamericana de Informatica, Aug. 1993.

Cifuentes, C., Malhotra, V. Binary Translation: Static, Dynamic, Retargetable?Proc. Int. Conf. on Software Maintenance, Monterey, CA, Nov. 1996.

Jones, A. et al. Pact HDL: A C Compiler Targeting ASICs anf FPGAs with Power and Performance Optimizations. Proc. CASES 2002, Grenoble, France, Oct. 2002.

Bala, V., Duesterwald, E., Banerjee, S. Dynamo: A Transparent Dynamic Optimization System. Proc. ACM SIGPLAN Conf. on Programming Language Design and Implementation (PLDI), Jun. 2000, pp. 1-12.

Gschwind, M., Altman, A., Sathaye, S., Ledak, P., Appenzeller, D. Dynamic and Transparent Binary Translation. IEEE Computer Magazine, vol. 33, No. 3, pp. 54-59, Mar. 2000.

Cifuentes, C., Gough, K.J. Decomplation of Binary Programs. Software—Practice and Experience, vol. 25(7), pp. 811-829, Jul. 1995.

* cited by examiner

Overview of the proposed FREEDOM compiler infrastructure

Overall flow of the compiler passes.

```
0.00   MPY  (2)   $A4,   2,     $A4
1.00   ADD  (1)   $A4,   4,     $A2
1.01   LD   (5)   *($A4),       $A2
2.00   ADD  (1)   $A4,   $A2,   $A3
```

Timestamps and delays for MSP instructions

FIG. 3

Control Flow Within the Parser Phase.

FIG. 5 Control flow within the MST Optimization phase.

CDFG Representation of a CALL Operation.

```
        VSUM:   MVK     .S1     500, A1
                ZERO    .L1     A7
                ZERO    .L1     A4
                B       .S2     LOOP
                LDW     .D1     *A4++, A6
||              B       .S2     LOOP
                LDW     .D1     *A4++, A6
||              B       .S2     LOOP
                LDW     .D1     *A4++, A6
||              B       .S2     LOOP
                LDW     .D1     *A4++, A6
||              B       .S2     LOOP
        LOOP:   ADD     .L1     A6, A7, A7
||      [A1]    LDW     .D1     *A4++, A6
||      [A1]    SUB     .S1     A1, 1, A1
||      [A1]    B       .S2     LOOP
                MVK     .L1     2000, A5
                STW     .D1     A7, *A5
```

(a). TI C6000 Assembly code for Vectorsum.

```
3.00            MOVE    (1)     1, $P0
  :               :
4.00            LD      (1)     *($A4), $A6_4
  :               :
5.00            MOVE    (1)     $A6_4, $A6_3
5.01            LD      (1)     *($A4), $A6_4
  :               :
6.00            MOVE    (1)     $A6_3, $A6_2
6.01            MOVE    (1)     $A6_4, $A6_3
6.02            LD      (1)     *($A4), $A6_4
  :               :
7.00            MOVE    (1)     $A6_2, $A6_1
7.01            MOVE    (1)     $A6_3, $A6_2
7.02            MOVE    (1)     $A6_4, $A6_3
7.03            LD      (1)     *($A4), $A6_4
  :               :
8.00    LOOP:   MOVE    (1)     $A6_1, $A6
8.01            MOVE    (1)     $A6_2, $A6_1
8.02            MOVE    (1)     $A6_3, $A6_2
8.03            MOVE    (1)     $A6_4, $A6_3
8.04            ADD     (1)     $A6, $A7, $A7
8.05    [$A1]   LD      (1)     *($A4), $A6_4
8.06            MOVE    (1)     0, $P0
8.07    [$P0]   GOTO    (0)     LOOP
  :               :
```

(b). Selected MST Instructions for Vectorsum.

FIG. 8

Control Flow for the CDFG Optimizations phase.

Structural Analysis on a given CFG.

```
c ← a + b          c ← a + b
d ← b         →    d ← b
e ← a + b          e ← c
```

Common Sub-expression Elimination example.

FIG. 11

$$a \leftarrow b$$
$$d \leftarrow a + c$$
$$e \leftarrow a + d$$

$$\rightarrow$$

$$a \leftarrow b$$
$$d \leftarrow b + c$$
$$e \leftarrow b + c$$

Copy Propagation example.

FIG. 12

```
if(1)  a ← b            a ← b
if(0)  c ← d      →  c ← c_prev
```

Constant Predicate Elimination Example.

FIG. 13

$$a \leftarrow b > 0$$
$$c \leftarrow a \mathrel{!}= 0 \quad \rightarrow \quad d \leftarrow b <= 0$$
$$d \leftarrow c == 0$$

Predicate Reduction Example.

FIG. 14

Loop Unrolling on CDFG Basic Blocks.

|     |     |      |          |
|-----|-----|------|----------|
|     | MV  | .L1  | A0, A1   |
| \|\| | MV  | .L2  | B0, B1   |
|     | MPY | .M1  | A1, A2, A3 |
| \|\| | MPY | .M2  | B1, B2, B3 |
|     | NOP |      | 1        |
|     | MPY | .M1  | A3, A6, A7 |
| \|\| | MPY | .M2  | B3, B6, B7 |
|     | NOP |      | 1        |
|     | ADD | .L1X | A7, B7, A8 |
|     | ADD | .L1  | A4, A8, A9 |

Example TI C6000 DSP Processor assembly code.

FIG. 16

CDFG and HDL representation of ASAP scheduled code

CDFG and HDL representation of ASAP scheduling with simple chaining for TI code

CDFG and HDL representation of ASAP scheduling with complex chaining

CDFG and HDL representation of ASAP scheduling with unconstraint chaining for TI code

```
dot_prod : dot_prod_1
(
    clock   <= clock
    reset   <= dot_prod_1_reset
    done    <= dot_prod_1_done
    DP      <= 0's
    A0      <= A0
    mem_addr <= dot_prod_1_mem_addr
    mem_d   <= dot_prod_1_mem_d
    mem_q   <= dot_prod_1_mem_q
    mem_we  <= dot_prod_1_mem_we
```

(a). HDL Representation of Dot Product process.

```
State: main_process_0
    mem_mux_ctrl <= 1
    dot_prod_1_reset <= 1
    State <= main_process_1

State: main_process_1
    dot_prod_1_reset <= 0
    if (dot_prod_1_done == 1)
        mem_mux_ctrl <= 0
        State <= main_process_2
    else
        State <= main_process_1
```

(b). HDL Representation of FSM controller for Dot Product process.

FIG. 21

```
Process: mem_mux_process
    switch( mem_mux_ctrl )
        case 1:
            mem_addr <= dot_prod_0_mem_addr
            mem_d <= dot_prod_0_mem_d
            dot_prod_0_mem_q <= mem_q
            mem_we <= dot_prod_0_mem_we
        case 2:
            mem_addr <= dot_prod_1_mem_addr
            mem_d <= dot_prod_1_mem_d
            dot_prod_1_mem_q <= mem_q
            mem_we <= dot_prod_1_mem_we
        default:
            mem_addr <= XXXXXXXXXX
            mem_d <= XXXXXXXXXXXXXXXXXX
            dot_prod_0_mem_q <= XXXXXXXXXXXXXX
            mem_we <= X
            dot_prod_1_mem_q <= XXXXXXXXXXXXXX
    end switch
end Process
```

HDL Process for Asynchronous Memory MUX Controller.

FIG. 22

METHOD AND SYSTEM FOR TRANSLATING SOFTWARE BINARIES AND ASSEMBLY CODE ONTO HARDWARE

BACKGROUND OF THE INVENTION

Field of the Invention

The present invention relates generally to the computer-aided design of digital circuitry such as field programmable gate arrays (FPGAs) and other programmable logic hardware and application specific integrated circuits (ASICs). Specifically, the invention provides a method and system for converting a description of an algorithm rendered in assembly language code or binary machine code of a general purpose processor, into an actual hardware implementation on an FPGA or ASIC.

As new processor architectures are announced, there is a need to reuse and migrate the software from older generation processors to the newer ones. In many cases, one may not have access to the high-level source code when migrating applications; only the assembly or binary code may be available. It is therefore highly desirable to have a technology to automatically translate the binary or assembly code from one architectural platform to another. In general, for many computationally intensive real-time applications such as voice-over-IP, video-over-IP, 3G and 4G wireless communications, JPEG and MPEG encoding/decoding applications, there will be parts of the application that will be run in software on a general purpose processor and other portions that need to run on an application-specific hardware for performance reasons. For these reasons, there will be an increasing set of software applications that will need to be migrated to System-on-a-Chip (SOC) platforms in the future that will integrate a general-purpose processor, some memory and some application specific hardware in the form of an Application Specific Integrated Circuit (ASIC) or Field-Programmable Gate Array (FPGA) on a single chip. The compiler provided by the present invention will assist embedded systems developers in the task of seamless migration of software binary codes from older general purpose embedded processors onto newer mixed hardware/software SOC platforms.

The problem of translating a high-level or behavioral language description into a register transfer level representation is called high-level or behavioral synthesis. Behavioral synthesis tools have been developed to take a behavioral description of an application in a language such as C/C++ or MATLAB and generate an RTL HDL implementation automatically. Panchul at al. have described a technique to convert designs in a high-level programming language, such as C, to hardware implementations. See, for example, Y. V. Panchul, D. A. Sodernman, D. A. Coleman, "System for Converting Hardware Designs in High-Level Programming Language to Hardware Implementations," U.S. Pat. No. 6,226,776, May 1, 2001. However this technique is only applicable to a high-level language description, not to the assembly or software binary level.

Recently, there has been a lot of work in the use of the C programming language and other high-level languages to generate synthesizable HDL codes or hardware implementations. See, for example, A. Jones et al, "PACT HDL: A C Compiler with Power and Performance Optimizations," Proc. CASES 2002, Grenoble, France, October 2002. There have been several commercial efforts to develop compilers translating C/C++ into VHDL or Verilog. Examples are Adelante, Celoxica and Forte Design. Recently, FPGA vendors, such as Xilinx and Altera, have developed system level tools for DSP applications called the System Generator and the DSP Builder, which allow DSP designers to design systems using a SIMULINK interface.

In contrast to traditional behavioral synthesis tools that take a behavioral description of an application in a language such as C/C++ or MATLAB and generate an RTL HDL implementation automatically, the compiler according to the present invention maps software binaries and assembly language codes into RTL VHDL for mapping onto FPGAs.

There has been some related work in the field of binary translation, in converting assembly or binary code written for one processor to another processor's ISA. The Transmeta Crusoe processor performs dynamic code translation on the fly using a technique called CodeMorphing by translating code from an Intel x86 ISA and targeting the Crusoe processor, a VLIW machine. Cifuentes et al. have done a lot of fundamental work in binary translation. See, for example, C. Cifuentes and K. J. Gough, "A Methodology for Decomposition", XIX Conferencia Latinoamericana de Informatica, August 1993, and C. Cifuentas and V. Malhotra, "Binary Translation: Static, Dynamic, Retargetable?", Proc. Int. Conf. On Software Maintenance, Monterey, Calif., November 1996. Bala et al. have developed the Dynamo system for dynamic binary optimization for the HP architecture. Gschwind has developed a similar system called BOA for the PowerPC architecture. Cooper et al have reported methods to construct Control and Data Flow Graphs from scheduled assembly code. See, for example, K. D. Cooper, T. Harvey, T. Waterman, "Building a Control Data Flow Graph from Scheduled Assembly Code," Technical Report, Dept. of Computer Science, Rice University, 2003. Bailey and Davidson introduced a formal model to specify procedure-calling conventions. See, for example, M. Bailey and J. Davidson, "A formal model and specification language for procedure calling conventions", ACM Symposium on Principles of Programming Languages, January 1995. Van Emmerik describes the use of patterns to identify library functions in executables. See, for example, Van Emmerik M. J., "Identifying Library Functions in Executable Files Using Patterns", *Proceedings of the* 1998 *Australian Software Engineering Conference*, Adelaide, 9th to 13th November, 1998, IEEE-CS Press, pp 90-97. Cifuentes and Simon reported a Procedure Abstraction Language that can be used to specify the calling conventions for different architectures. See, for example, C. Cifuentes and D. Simon, "Procedure Abstraction Recovery from binary code", Dept. of Computer Science, University of Queensland, 1999.

Rather than translating from one fixed ISA to another, the compiler provided by the present invention automatically translates code from one ISA into hardware in the form of RTL HDL.

Stitt and Vahid have reported work on hardware-software partitioning of binary codes. They took kernels from frequently executed loops at the binary level for a MIPS processor and investigated their hardware implementations on a Xilinx Virtex FPGA; this study was done manually. Stitt et al. have recently reported work on dynamic partitioning of hardware/software of software binaries for a MIPS processor. They have developed an approach to take kernel functions consisting of simple loops and automatically map them onto reconfigurable hardware. The hardware used is significantly simpler than commercial FPGA architectures. The automatic generation of RTL code is limited to only combinational logic. Hence the loops that must be implemented on the hardware are implemented in a single cycle. This approach only works for sequential memory addresses and fixed size loops. The focus of their work is on fast dynamic hardware software partitioning, whereas the software tool provided by the present invention provides the actual automated synthesis of software binaries onto hardware.

Levine and Schmidt have proposed a hybrid architecture called HASTE, which consists of an embedded processor and a reconfigurable computational fabric (RCF) inside a chip. Instructions from the processor are dynamically compiled onto the RCF using a hardware compilation unit (HCU). Ye et al. have developed a compiler for the CHIMAERA architecture with a similar architecture of a general-purpose processor connected to a reconfigurable functional unit (RFU).

CriticalBlue has recently announced the launch of its Cascade Tool Suite. The Cascade Tool Suite synthesizes a hardware co-processor specifically designed to accelerate software tasks selected by the user. The Cascade Tool Suite inputs a compiled object code for an ARM processor and generates a cycle accurate C model, and a RTL VHDL and Verilog model to synthesize a co-processor architecture in hardware in the form of an ASIC.

There is a large established code base of embedded software algorithms that are optimized for embedded processors, such as the ARM and ARM7 processors, MIPS R3000 processor, Intel StrongARM processor, Texas Instruments C6000 processors, Phillips Trimedia processor, the Motorola MCORE and MC68000 processors, the IBM PowerPC processors and Intel IA-64 [9] processor. Some of the code is available only in binary or assembly code in the form of Intellectual Property (IP) libraries that can be compiled along with a user application. The compiler provided by the present invention allows engineers to rapidly develop IP blocks for useful functions on hardware/software platforms by moving computationally intensive kernels onto hardware in the form of FPGAs and ASICs and SOCs.

If embedded software developers wish to have an automated path from high-level languages to hardware, compilers are available to compile C, C++, Java, Fortran, Ada and MATLAB programs onto assembly and binary codes of embedded processors. Some example tools include the Wind River Systems Tornado IDE, the Green Hills Software MULTI SDT, the Metrowerks' CodeWarrior IDE and Mathworks' Real Time Workshop. Hence, the binary or assembly codes can be used as an intermediate representation from all high-level languages. The compiler provided by the present invention takes these embedded software implementations in binary or assembly code and generate implementations onto hardware platforms automatically.

Many embedded systems engineers develop software code directly in assembly code for optimized performance or compactness of memory usage. The compiler provided by the present invention takes these embedded implementations in assembly code and generates implementations onto hardware platforms.

There have been some previous efforts to take applications written in high-level languages such as MATLAB, C or C++ and mapping them into hardware using behavioral synthesis tools. One problem with this approach is that they require the users to convert floating point algorithms to fixed-point versions in order to produce low-cost hardware. This conversion often causes large round-off and truncation errors that have to be dealt with by the hardware designers. The advantage of the approach according to the present invention is that the embedded processor assembly code has already been converted from a floating point to fixed-point representation; hence the generation of the fixed-point hardware RTL code is relatively straightforward.

Many recent System-on-a-Chip (SOC) architectures, such as the Xilinx Virtex II Pro architecture and the Altera Excalibur architecture, have an integrated chip that contains an embedded processor and some programmable logic. Hence it is natural to look at hardware/software partitioning of binary codes that are originally purely software implementations on these embedded processors, and move selected parts of these codes to hardware. The compiler provided by the present invention enables such a smooth transition of automatic translation of hardware software partitioning.

It is accordingly the primary objective of the present invention that it provide a method and system for translating software binaries and assembly code onto hardware.

A more specific objective of the present invention is that it provide a method and system for converting a description of an algorithm rendered in assembly language code or binary machine code of a general purpose processor, into an actual hardware implementation on an FPGA or ASIC.

A further objective of the present invention is that it provide a compiler that assists embedded systems developers in the task of seamless migration of software binary codes from older general purpose embedded processors onto newer mixed hardware/software SOC platforms.

It is another objective of the present invention that it provide a compiler that allows engineers to rapidly develop IP blocks for useful functions on hardware/software platforms by moving computationally intensive kernels onto hardware in the form of FPGAs and ASICs and SOCs, for example.

Yet another objective of the present invention is that it provide a compiler that takes embedded software implementations in binary or assembly code and generate implementations onto hardware platforms automatically.

REFERENCES

Background information, together with other aspects of the prior art, including those teachings useful in light of the present invention, are disclosed more fully and better understood in light of the following references, each of which is incorporated herein in its entirety.

[1] ARM Ltd, "ARM7 Datasheet," www.arm.com.
[2] MIPS Corporation, "MIPS R3000 Datasheet," www.mips.com.
[3] Intel Corporation, "Intel StrongARM SA 1100 Microprocessor Developers Manual," October 2001.
[4] Texas Instruments, "TMS320 C6000 Architecture Description," www.ti.com.
[5] Phillips Corporation, "Trimedia Architecture Description," www.phillips.com.
[6] Motorola Corporation, "MCORE Datasheet," www.motorola.com.
Motorola Corporation, "MC68000 Processor Datasheet," www.motorola.com.
[8] IBM Corporation, "PowerPC Processor Architecture Description Datasheet," www.ibm.com.
[9] J. Huck, D. Morris, J. Ross, A. Knies, H. Mulder, R. Zahir, "Introducing the IA-64 Architecture," *IEEE Micro*, Sep.-Oct. 2000.
[10] Xilinx Corporation, "Virtex II Pro Datasheet," www.xilinx.com.
[11] Altera, "Stratix Datasheet," www.altera.com.
[12] Altera Corporation, "Excalibur Datasheet," www.altera.com.
[13] Wind River Systems, "Tornado Integrated Development Environment," www.windriver.com.
[14] Green Hills Software, Inc., "MULTI Software Development Tool," www.ghs.com.
[15] Metrowerks, Inc., "Code Warrior IDE," www.metrowerks.com.

[16] Mathworks Corp, "Real-Time Workshop Datasheet," www.mathworks.com.

[17] Synplicity. Synplify Pro Datasheet, www.synplicity.com.

[18] N. Ramsey, and M. F. Fernandez, "Specifying Representations of Machine Instructions", ACM Transactions on Programming Languages and Systems, May 1997.

[19] N. Ramsey, and M. F. Fernandez, "New Jersey Machine-Code toolkit", Proceedings of the 1995 USENIX Technical Conference, January 1995.

[20] G. DeMicheli, Synthesis and Optimization of Digital Circuits, McGraw Hill, 1994.

[21] Steven S. Muchnick. Advanced Compiler Design Implementation. Morgan Kaufmann, San Francisco, Calif.

[22] C. Cifuentes and K. J. Gough, "A Methodology for Decompilation", XIX Conferencia Latinoamericana de Informatica, August 1993.

[23] C. Cifuentas and V. Malhotra, "Binary Translation: Static, Dynamic, Retargetable?", Proc. Int. Conf. On Software Maintenance, Monterey, Calif., November 1996.

[24] A. Klaiber, "The Technology Behind Crusoe Processors," Transmeta Corp., White Paper, January 2000, www.transmeta.com.

[25] G. De Micheli, D. Ku, F. Mailhot, T. Truong, "The Olympus Synthesis System for Digital Design." *IEEE Design & Test of Computers* 1990.

[26] A. Jones et al, "PACT HDL: A C Compiler with Power and Performance Optimizations," Proc. CASES 2002, Grenoble, France, October 2002.

[27] M. Haldar, A. Nayak, A. Choudhary, and P. Banerjee, "A System for Synthesizing Optimized FPGA Hardware from MATLAB," *Proc. Int. Conf. on Computer Aided Design*, San Jose, Calif., November 2001.

[28] G. Stitt and F. Vahid, "Hardware/Software Partitioning of Software Binaries," Proc. Int. Conf. Computer Aided Design (ICCAD), Santa Clara, Calif., November 2002, pp. 164-170.

[29] G. Stitt et al, "Dynamic Hardware/Software Partitioning: A First Approach," Proc. Design Automation Conf., Anaheim, Calif., June 2003, pp. 250-255.

[30] B. Levine, H. Schmidt, "Efficient Application Representation for HASTE: Hybrid Architectures with a Single Executable", Proc. IEEE Symp. FCCM, April 2003.

[31] Z. Ye, S. Hauck, N. Shenoy, P. Banerjee, "CHIMAERA: A High-Performance Architecture with a Tightly-Coupled Reconfigurable Functional Unit," Proc. 27th International Symposium on Computer Architecture, Vancouver, CANADA, Jun. 10-14, 2000.

[32] CriticalBlue, Cascade Tool Set, www.criticalblue.com.

[33] V. Bala, E. Duesterwald, S. Banerjea, "Dynamo: A Transparent Dynamic Optimization System," Proc. ACM SIGPLAN Conf. On Programming Language Design and Implementation (PLDI), June 2000, pp. 1-12.

[34] M. Gschwind, A. Altman, S. Sathaye, P. Ledak, D. Appenzeller, "Dynamic and Transparent Binary Translation," IEEE Computer Magazine, Vol. 33, No. 3, pp. 54-59, March 2000.

[35] David Callahan et al, "Constructing the procedure call multigraph", IEEE Trans. Software Engineering, April 1990.

[36] K. D. Cooper, T. Harvey, T. Waterman, "Building a Control Data Flow Graph from Scheduled Assembly Code," Technical Report, Dept of Computer Science, Rice University, 2003.

[37] M. Bailey and J. Davidson, "A formal model and specification language for procedure calling conventions". ACM Symposium on Principles of Programming Languages, January 1995.

[38] Van Emmerik M. J., "Identifying Library Functions in Executable Files Using Patterns", *Proceedings of the 1998 Australian Software Engineering Conference*, Adelaide, 9th to 13th November, 1998, IEEE-CS Press, pp 90-97.

[39] C. Cifuentes and D. Simon, "Procedure Abstraction Recovery from binary code", Dept. of Computer Science, University of Queensland, 1999.

[40] Y. V. Panchul, D. A. Sodernman, D. A. Coleman, "System for Converting Hardware Designs in High-Level Programming Language to Hardware Implementations," U.S. Pat. No. 6,226,776, May 1, 2001.

[41] U. Banerjee, R. Eigenmann, A. Nicolau, and D. Padua. "Automatic program parallelization," *Proceedings of IEEE*. Vol. 81, No. 2, February 1993.

[42] Adelante Technologies, "A|RT Builder," www.adelantetechnologies.com.

[43] Celoxica Corp, Handle C Design Language, www.celoxica.com.

[44] Forte Design Systems, Behavioral Design Suite, www.fortedesign.com.

[45] Xilinx, System Generator Datasheet, www.xilinx.com.

[46] Altera Corp., DSP Builder Datasheet, www.altera.com.

SUMMARY OF THE INVENTION

The disadvantages and limitations of the background art discussed above are overcome by the present invention. With this invention, there is provided a method and system for translating software binaries and assembly code onto hardware.

In accordance with the invention, converting a software assembly program to a hardware design includes creating a machine level syntax tree (MST) representation of the software assembly program in a given software binary program. The machine-level syntax tree representation is compiled into a Control and Data Flow Graph (CDFG) representation of the software assembly program, and the CDFG representation of the software assembly program is compiled into a hardware description language (HDL) state machine. The HDL state machine is compiled into a Register Transfer Level (RTL) VHDL or Verilog language and the RTL VHDL or Verilog language is compiled onto a hardware representation onto a programmable circuit device using a synthesis program and a physical design program.

The method in accordance with the present invention utilizes various methodologies and compiler optimizations in novel ways in order to exploit the inherent parallelism of the programmable circuit devices, such as FPGAs or an ASICs. A key step in applying some of these optimizations is the recognition of high-level language constructs, such as loops and arrays. Structural Analysis is applied to the CDFG for the recognition of high-level language constructs, such as loops and conditionals.

Further in accordance with the invention, there is provided a system for converting a software assembly program to a hardware design. The system includes a processor and a data structure including a parsing engine, an MST engine, a CDFG engine and an HDL engine. The parsing engine controls the processor to create a machine level syntax tree (MST) representation of the software assembly program in a given software binary program. The MST engine controls the processor to compile the machine-level syntax tree representation into a Control and Data Flow Graph (CDFG) representation of the software assembly program. The CDFG engine controls the processor to compile the CDFG representation of the software assembly program into a hardware description language (HDL) state machine. The HDL engine controls the processor to compile the HDL state machine into a Register Transfer Level (RTL) VHDL or Verilog language and to compile the RTL VHDL or Verilog language onto a hardware representation on a programmable circuit device. The HDL engine includes a synthesis program and a physical design program.

Thus, the present invention provides a methodology and compiler to translate software binaries or assembly code, targeted for general-purpose processors, into Register Transfer Level (RTL) VHDL or Verilog code for subsequent mapping to programmable circuit devices, including, but not limited to, field-programmable gate arrays (FPGAs) and application specific integrated circuits (ASICs). The compiler in accordance with the present invention utilizes various methodologies and compiler optimizations in novel ways in order to exploit the inherent parallelism of the FPGAs or ASICs. A key step in applying some of these optimizations is the recognition of high-level language constructs, such as loops and arrays. Structural Analysis is applied to the CDFG for the recognition of high-level language constructs, such as loops and conditionals. In addition, testbenches are generated automatically to verify the correctness of the outputs. The testbenches are used to guarantee bit-true behavior in the synthesized hardware compared to that of the original assembly code versions.

DESCRIPTION OF THE DRAWINGS

These and other advantages of the present invention are best understood with reference to the drawings, in which:

FIG. 3 illustrates timestamps and delays for MST instructions, and is used to illustrate the structure of the Machine Syntax Tree;

FIG. 8(a) shows assembly code for Vectorsum;

FIG. 8(b) shows selected MST Instructions for Vectorsum;

FIG. 11 is an example of a common sub-expression elimination;

FIG. 12 is an example of copy propagation;

FIG. 13 is an example of a constant predicate elimination;

FIG. 14 is an example of a predicate reduction; and

FIG. 16 is an example of a processor assembly code;

FIG. 21a is an HDL representation of a Dot Product process;

FIG. 21b is an HDL representation of an FSM controller for the Dot Product process;

FIG. 22 illustrates an HDL process for an asynchronous memory MUX controller.

DETAILED DESCRIPTION OF THE PREFERRED EMBODIMENT

The methodology and compiler of the present invention translates software binaries or assembly code, targeted for general-purpose processors, into Register Transfer Level (RTL) VHDL or Verilog code for subsequent mapping to programmable circuit devices including, but not limited to, field-programmable gate arrays (FPGAs) and application specific integrated circuits (ASICs). The compiler in accordance with the present invention utilizes various methodologies and compiler optimizations in novel ways in order to exploit the inherent parallelism of the FPGAs or ASICs. A key step in applying some of these optimizations is the recognition of high-level language constructs, such as loops and arrays. Structural Analysis is applied to the CDFG for the recognition of high-level language constructs, such as loops and conditionals. The methodology and compiler are now described with reference to the drawings.

Figure 1:
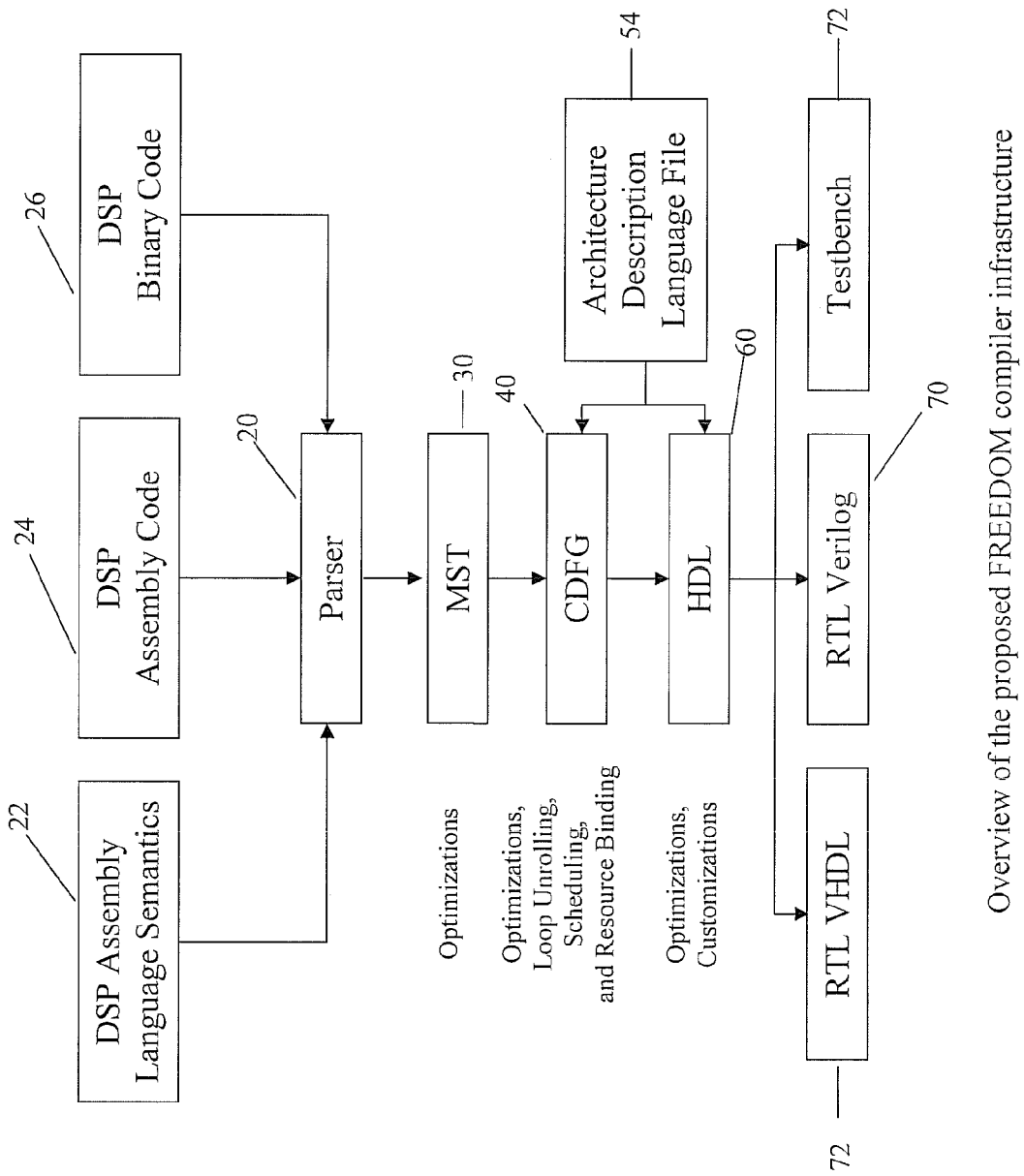
FIG. 1 is an overview of the compiler provided by the present invention.
Figure 2:
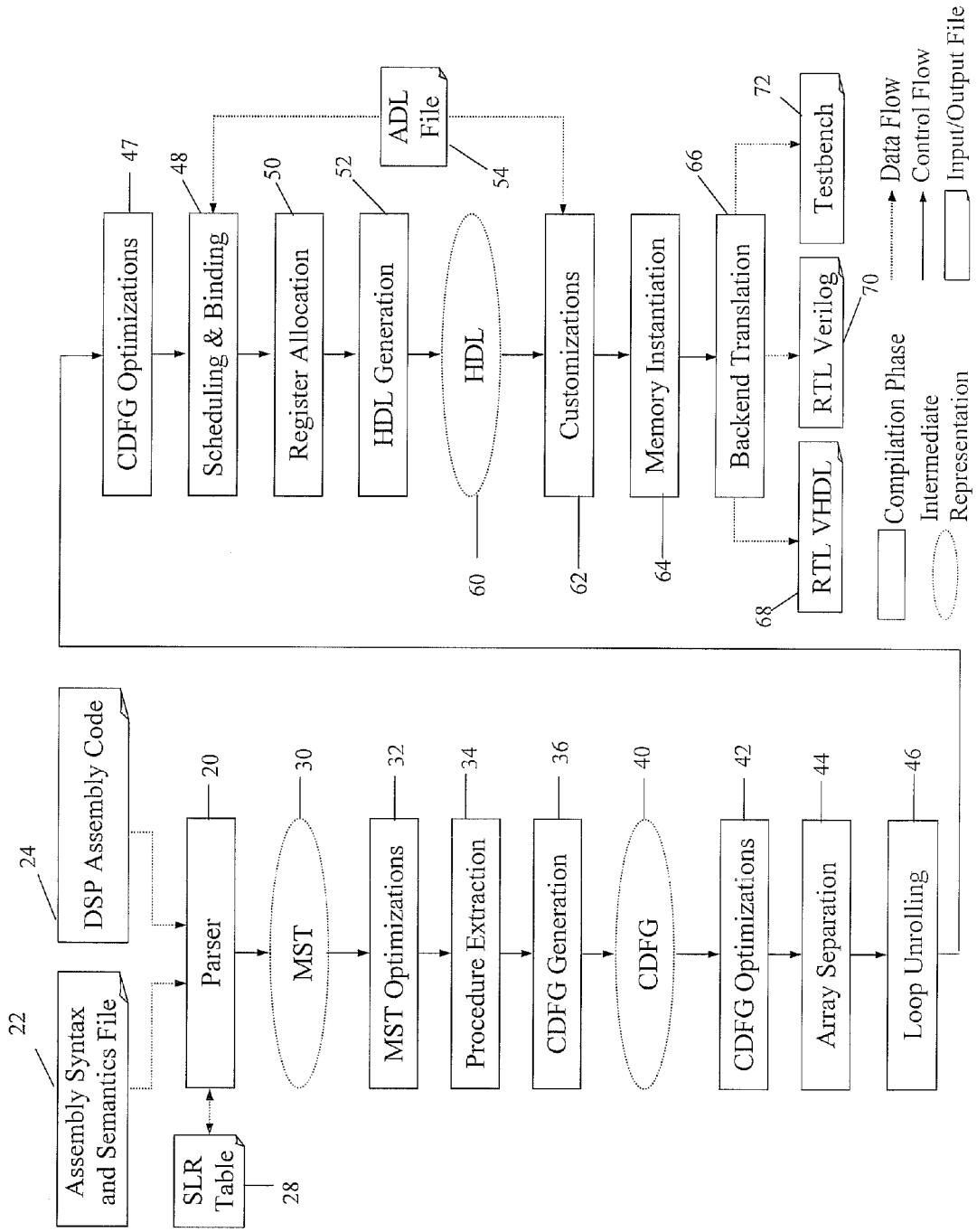
FIG. 2 is an overview of the infrastructure and compilation process of the compiler provided by the present invention, and showing the different passes used to convert the assembly code to the target platform.

FIG. 1 provides an overview of the compiler's infrastructure and FIG. 2 provides an overview of the compilation process in accordance with the invention. A key in the lower right hand corner of FIG. 1 (also shown in FIGS. 4-6) indicates the symbols used to represent compilation phase, intermediate representation, data flow, data control and input/output files. With reference to FIG. 1, the compiler infrastructure includes a parser 20 which provides a common entry point for all assembly languages. The front-end takes as input a description of the processor instruction set architecture (ISA) in order to configure the assembly language parser. The parser uses ISA specifications written in SLED, from the New Jersey Machine-Code toolkit reported by N. Ramsey, and M. F. Fernandez, in an article titled "New Jersey Machine-Code toolkit", Proceedings of the 1995 USENIX Technical Conference, January 1995 coupled with a new semantic description language designed for this tool. Thus, inputs to the parser 20 include assembly syntax and semantics files 22, digital signal processing (DSP) assembly code 24 and a DSP binary code 26. The parser 20 generates a virtual assembly representation an abstract syntax tree called the Machine language Syntax Tree (MST) 30. The MST is converted into a Control and Data Flow Graph (CDFG) 40 in which MST instructions are grouped into different basic blocks and broken up into node representations. Architecture specific information can be acquired via Architecture Description Language(ADL) files 54 which include data pertaining to resource availability, signal, names and other necessary information. The CDFG is translated into another intermediate abstract syntax tree, analogous to high-level Hardware Description Language (HDL) 60. The HDL 60 models processes, concurrency, and finite state machines using the ADL files 54. The complete HDL is translated directly to RTL VHDL 68 and RTL Verilog 70 to be mapped onto FPGAs, while automatically generating a testbench 72 to verify the correctness of the outputs.

Reference is now made also to FIG. 2 which provides an overview of the compilation process of the compiler of FIG. 1 in accordance with the invention. In block 32, various optimizations are performed on the MST 30, including expanding no operation (NOP) instructions, strength reduction, constant folding and resolving undefined branch destinations and handling pipelined operations. The MST optimizations can also include scalarizing array indices, generation of a Control Flow Graph (CFG), levelization of pipelined operations, predicated branch elimination and instruction resequencing. The MST optimizations 32 are followed by procedure extraction 34. Then, in block 36, the MST is converted into a Control and Data Flow Graph (CDFG) 40 in which MST instructions are grouped into different basic blocks and broken up into node representations.

Further optimizations are performed on the CDFG, block 42 (and block 47), to increase parallelism and reduce the design size as is described below with reference to FIG. 9. These optimizations can include the identification of input/output ports, single static variable assignment, undefined variable elimination, common sub-expression elimination, redundant memory access elimination, copy propagation, constant folding and constant propagation. The CDFG optimizations also can include strength reduction, constant predicate elimination, predicate reduction, merging block sets and dead-code elimination. Block 44 provides array separation and block 46 provides loop unrolling. Scheduling and resource binding 48 are performed on the CDFG where computations in each basic block are mapped onto various resources (adders, multipliers, etc.) in different states within a finite state machine. Architecture specific information can be acquired via Architecture Description Language(ADL) files 54 which include data pertaining to resource availability, signal, names and other necessary information. Block 50 provides register allocation. In block 52, the resulting CDFG is translated into another intermediate abstract syntax tree, analogous to high-level Hardware Description Language (HDL) 60.

The HDL 60 models processes, concurrency, and finite state machines. In block 62, additional optimizations and customizations are performed on the HDL, using the ADL files 54, to enhance the efficiency of the output and to correctly support the architecture of the target devices. Memory models are generated in the HDL, block 64, as required by backend synthesis tools 66 to automatically infer synchronous and a synchronous RAMs. The complete HDL is translated directly to RTL VHDL 68 and RTL Verilog 70 to be mapped onto FPGAs, while automatically generating a testbench 72 to verify the correctness of the outputs. The testbenches 72 are used to guarantee bit-true behavior in the synthesized hardware compared to that of the original assembly code versions.

The MST representation 30 is similar to the MIPS processor ISA in syntax, and is generic enough to encapsulate most ISAs, including but not limited to ARM7 architecture by ARM Corporation, the R3000 architecture by MIPS Corporation, the StrongARM SA1100 architecture by Intel Corporation, the IA-32 and IA-64 architecture reported by J. Huck, D. Morris, J. Ross, A. Knies, H. Mulder and R. Zahir in an article entitled "Introducing the IA-64 Architecture," *IEEE Micro*, Sep.-Oct. 2000, the 320TMS C6000 architecture by Texas Instruments, the Trimedia architecture by Phillips Corporation, the MCORE architecture by Motorola, the PowerPC architecture by IBM corporation and the SPARC architecture by SUN Microsystems. The MST supports predicated and parallel instruction sets. All MST instructions are three-operand, predicated instructions. One or more of the operands may be null.

The MST represents the intermediate format between the assembly code and the Control Data Flow Graph (CDFG). An MST design is made up of procedures, each containing a list of instructions. An MST instruction will be composed of operators, operands, labels, predicates and comments. An MST Instruction is defined as:

Label: if (pred OR (pred==null)) then do op (src1, src2)→dst.

Operator types include, but are not limited to: logical operators (AND, NAND, NEG, NOR, NOT, OR, SLL, SRA, SRL, XNOR, XOR), arithmetic operators (ADD, DIV, MULT, SUB), branch operators (BEQ, BGEQ, BGT, BLEQ, BLT, BNEQ, GOTO, JMP, CALL), comparison operators (CMPEQ, CMPNEQ, CMPLT, CMPLE, CMPGT, CMPGE), assignment operators (LD, ST, MOVE, UNION), and general operators (NOP). Operand types include: memory addresses, registers, immediate values, and labels.

Procedure, function or library calls may be implemented within an MST instruction set using the CALL operator in the branch operator types. The destination operand of the CALL instruction is a label containing the name of procedure, function or library.

Some processor ISAs, such as the TI C6000 and the Intel/HP IA-64 architectures, have constructs for predicated instructions as shown in FIG. 8($a$) using the '[ ]' constructs. All instructions in the MST will be three-operand, predicated instructions. One or more of the operands may be null. If a predicate is not specified, it will be assumed to be true. Some processor ISAs, such as the TI C6000 and the Intel/HP IA-64 processors have constructs for specification of parallel instructions as shown in FIG. 8($a$) using the '||' constructs.

The fixed number of physical registers on processors necessitates the use of advanced register reuse algorithms by compilers. This introduces false dependencies based on the register names, and results in difficulties when determining correct data dependencies, specifically when dealing with scheduled or pipelined binaries and parallel instruction sets. As a solution, each MST instruction in the compiler is assigned a timestamp, specifying a linear instruction flow. Each cycle will begin with an integer base stamp 'T'. Parallel instructions in the DSP assembly, such as LDW || SUB || ADD, will be assigned the timestamps '$T_n$=T+0.01×n' in succession. Complex assembly instructions, such as Multiply-accumulate (MAC), that expand to more than one MST instruction (MULT and ADD) are assigned timestamp values '$T_n$=T+0.0001×n'. Each MST instruction also is assigned an operation delay. The write-back time for the instruction, or the cycle in which the result in the destination register is valid, is defined as wb=timestamp+delay. If a predicated assembly instruction is expanded into multiple MST instructions, the predicate is copied to each expanded MST instruction.

FIG. 3 shows how the timestamp and delay are used to determine data dependencies. In the first instruction, the MPY operation has one delay slot and therefore requires two cycles to complete. The new value of register A4 is not written until the end of cycle 1, and may only be used at the beginning of cycle 2. Consequently, the first three instructions are dependant on the same source register A4. Similarly, the ADD instruction at cycle 2.00 is dependant on registers A4 in cycle 0.00 and A2 in cycle 1.00, but not on register A2 of the LD instruction at cycle 1.01.

Figure 4:
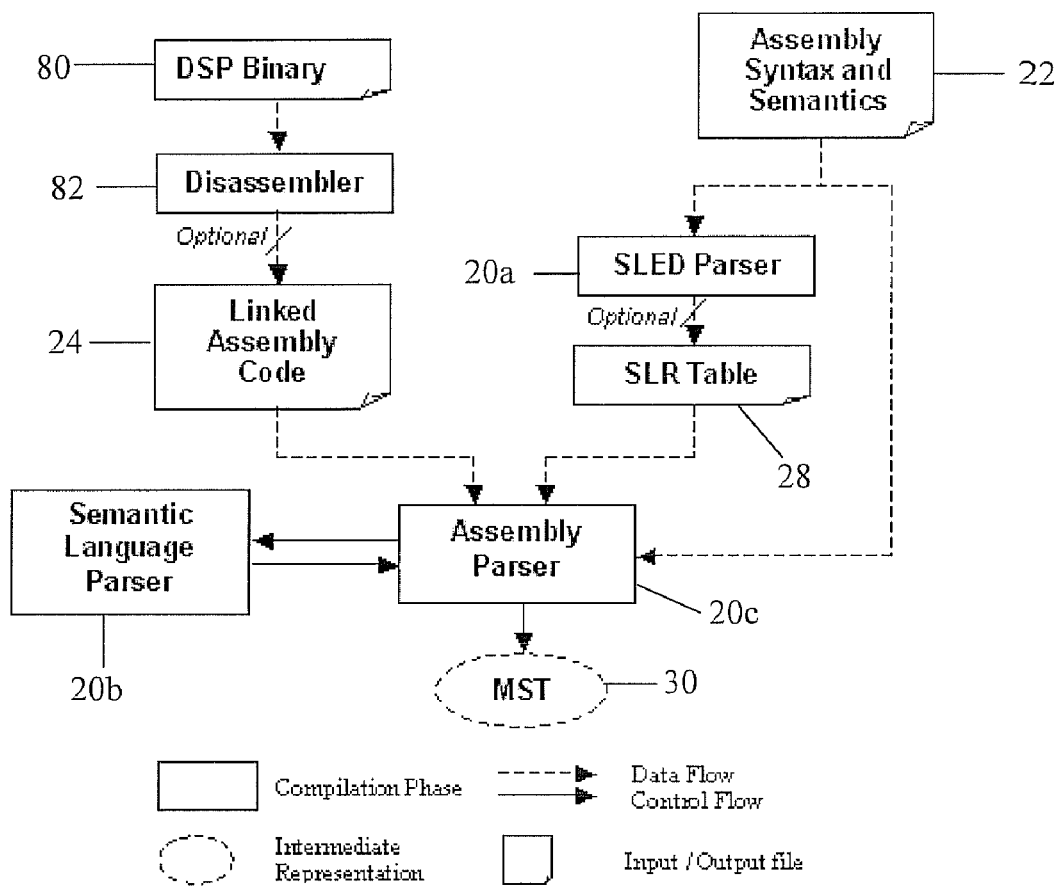
FIG. 4 illustrates the structure and flow of the assembly language Parser of the compiler of FIG. 2 and shows the steps used to parse the assembly code.

FIG. 4 illustrates the structure of the assembly language parser 20 of FIG. 2. The parser requires the ISA description file (SLED plus semantic language) and the assembly code. The assembly code can be generated from the binary code 80 for the given source processor platform by using an appropriate disassembler 82. The parser consists of three parts: 1) a SLED parser 20a, 2) a semantic language parser 20b, and 3) an assembly code parser 20c. The SLED parser is written using a lexical generator, such as FLEX, and a parser generator, such as BISON, as disclosed, for example, by Steven S. Muchnick, in Advanced Compiler Design Implementation, Morgan Kaufmann, San Francisco, Calif. The semantic language parser 20b is written using FLEX and BISON. The assembly code parser 20c is written in C++. The ISA description file is used to generate a Shift-Left-Reduce (SLR) table 28 that is stored using a novel ASCII based representation. The SLR table 26 can be reused and need not be regenerated for a particular architecture. Thus, the SLR table 28 constitutes a third input to the parser 20 and serves to configure the parsing function of the tool. The semantic language parser 20b parses the semantic code associated with SLED descriptions for the instruction. This novel semantic language is used to represent the functionality of the assembly instructions. The parser 20 translates these semantic descriptions to representative MST instructions.

Figure 5:
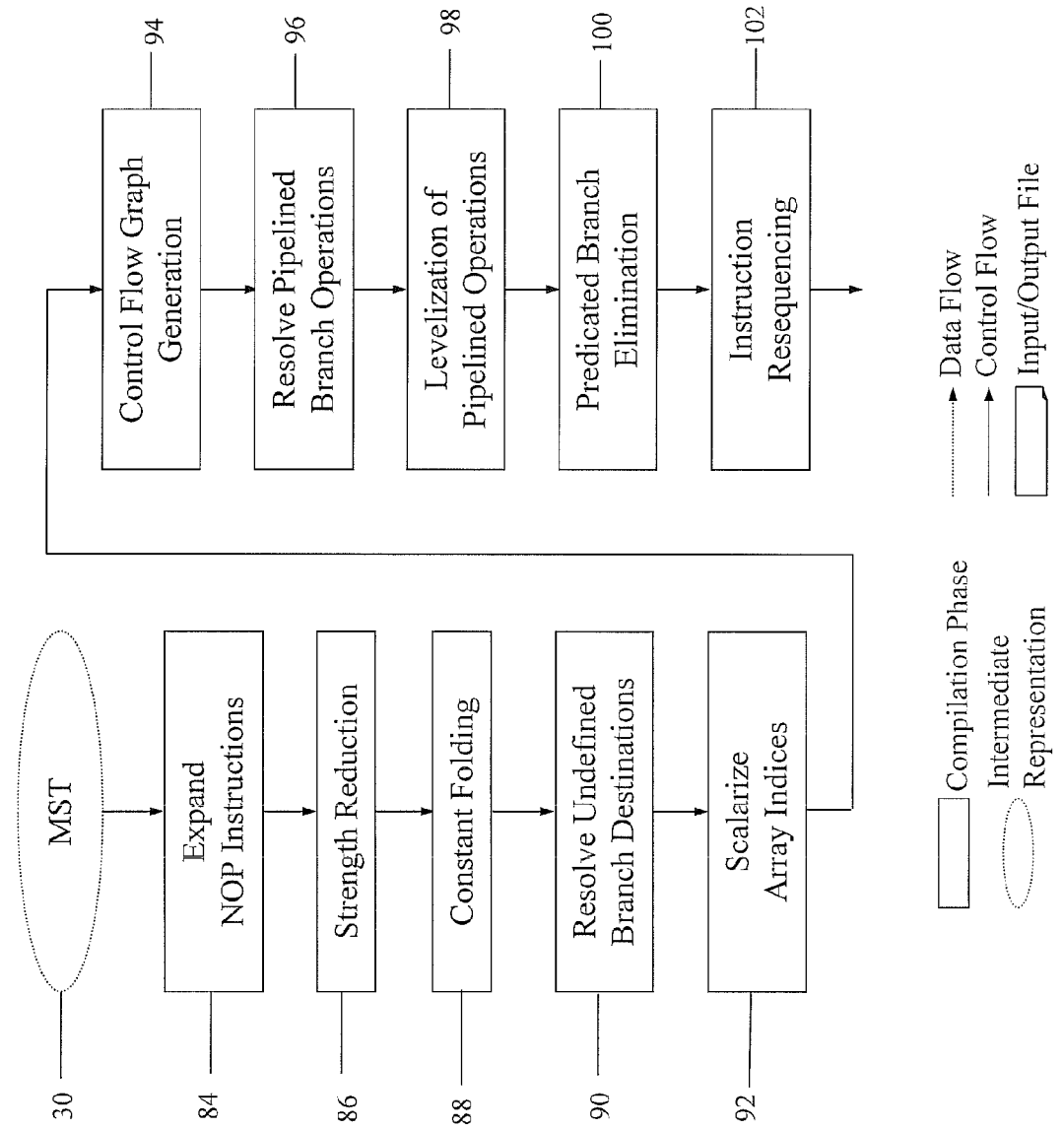
FIG. 5 illustrates the MST optimization phase of the compiler of FIG. 2.

FIG. 5 illustrates the MST optimization phase of the compiler, which corresponds to block 32 in FIG. 2. A limited number of optimizations are performed on the MST, whose purpose is to mold the assembly code into a format suitable for translation into a Control and Data Flow Graph (CDFG) for which data dependencies may easily be determined. FIG. 5 describes the flow of the different optimizations that are implemented for the MST. The optimizations can include expanding NOP instructions 84, strength reduction 86, constant folding 88 and resolving undefined branch destinations 90. The MST optimizations can also include scalarizing array indices 92 and generation of a Control Flow Graph (CFG) 94. The MST optimization can include optimizations directed to minimizing difficulties arising when attempting to analyze data dependencies, such as resolving pipelined branch operations 96, levelization of pipelined operations 98 and predicated branch elimination 100. In addition, the MST optimizations can include instruction resequencing 102.

The first optimization is to expand NOP instructions with multi-cycle delays into multiple single cycle NOP instructions, block 84. For instance, a NOP 5 would be converted into five NOP 1 instructions, with each timestep successively incremented by one. When building a Control Flow Graph, in certain cases a block may potentially end in the middle of a multi-cycle NOP instruction. This optimization allows the functionality and instruction cycles to remain consistent when building the CDFG.

Strength Reduction, block 86, is an optimization that replaces operations that are costly in terms of area, power or cycle time with less expensive ones. For instance, multiplication by a factor of two may be replaced by a shift operation. Unnecessary operations are also replaced Constant Folding, block 88, is an optimization that solves for operations on constant values at compile time. It replaces expressions consisting of operations on known constant values with their resultant values. It affects a reduction in extraneous computations and area. We may then rely on Constant Propagation to further reduce the CDFG.

Resolving Undefined Branch Destinations, block 90, is an optimization that attempts to solve for branch-to-PC (program counter) values and branch-to-register values. In the former case, a label replaces the PC value in the destination operand of the branch instruction, while the same label is also added to the instruction with the corresponding PC. For branch-to-registers, we attempt to determine all possible register values using a form of alias analysis. The branch instructions are then expanded into multiple conditional branches, where we compare the branch's destination register to each possible value. The destination label in each new conditional branch instruction is also inserted as a label in the instruction with the corresponding PC value.

Scalarization of Array Indices, block 92, is an optimization which replaces a memory address and offset with an instruction that adds the two values and then accesses the resulting address. For instance, if an instruction accesses memory address *B[O], where B is the base address and O is the offset, the memory address is replaced by a virtual address R←B+O.

With reference to block 94, while constructing the control flow graph (CFG) from the MST 30, scheduled or pipelined software binaries present many difficulties when attempting to analyze data dependencies. In the Vectorsum example in FIG. 8(a), each branch instruction is executed in consecutive iterations of the loop. Furthermore, the dependencies of the ADD instruction in the loop body change with each loop-iteration. Three steps, blocks 96, 98 and 100, are required to correctly determine data dependencies in scheduled assembly codes. The first step, block 96 is to build a correct control flow graph representation, using the algorithm developed by Cooper et al., disclosed in an article by K. D. Cooper, T. Harvey, T. Waterman, entitled "Building a Control Data Flow Graph from Scheduled Assembly Code," Technical Report, Department of Computer Science, Rice University, 2003.

Once the CFG has been generated, the second step is to levelize pipelined operations, block 98, by introducing virtual temporary registers to break up a multi-cycle instruction whose write-back time occurs in another block into multiple single-cycle instructions. For an instruction with n delay slots, the original instruction is written to a temporary virtual register $R_n$ and the delay on the instructions is changed to one cycle. In each successive cycle, we move virtual registers $R_{n-1} \leftarrow R_n$, $R_{n-2} \leftarrow R_{n-1}$, ... $R_0 \leftarrow R_1$, where $R_0$ is the original register name. This approach assumes that no two instructions are ever scheduled to write back to the same register in the same cycle. When the end of a block is reached, the assignments are propagated to the target and fall-through blocks. We may eliminate redundant virtual register assignments by keeping track of the cycles to which they have been written.

FIG. 8(b) shows selected MST instructions for Vectorsum. We determine that the LD instruction in cycle 4 with four delay slots has its write-back stage in the fall-through block (LOOP). The LD is now written to virtual register A6_4 and the instruction delay is changed from five cycles to one cycle. In cycle 5, A6_4 is written to A6_3; in cycle 6, A6_3 is written to A6_2; in cycle 7, A6_2 is written to A6_1. The path continues to the fall-through block, where A6_1 is written to the original register A6 in cycle 8. Similarly, we determine the write-back stage of the LD instruction in cycle 5 occurs at the end of the second iteration of the LOOP block, and perform the same procedure as above. Although this LD instruction writes to register A6_4 in parallel with the assignment of A6_4 to A6_3, nevertheless, the one cycle delay on the former forces the latter to be correctly dependant on the previous value of A6_4 in cycle 4. The final two virtual register assignments for this instruction occur in cycle 8 of the LOOP block.

The third step, block 100, is to linearize pipelined branch operations by moving a copy of the branch instruction to all possible write-back times in the CFG and setting its delay to zero. The source and predicate operands of the branch instruction are stored in temporary virtual registers. If a branch operation is not predicated, but its execution time falls outside its current block in the CFG, a predicate is added to the instruction. An example is shown in cycle 3 of FIG. 8(*b*). If the normal control flow passes through the branch instruction's original position in cycle 3, the virtual predicate operand P0 is set. When the control flow reaches the branch instruction's intended execution stage at the end of cycle 8, P0 is reset in parallel with the branch execution, thus preventing the branch instruction from further execution outside normal control flow.

Instruction Resequencing, block 102 is a simple stable sort optimization which ensures that all instructions are ordered by their timestep.

Referring again to FIG. 2, compiling the CDFG representation into a hardware description language (HDL) state machine includes determining the presence of function and procedure calls in the MST representation of the program and mapping each of the functions onto a separate HDL process. In block 34, functions and procedures are extracted from the linked assembly using an idiomatic approach. Three passes are used to identify function bodies within the binary, using known calling convention procedure to recognize caller prologues and callee epilogues.

Figure 6:
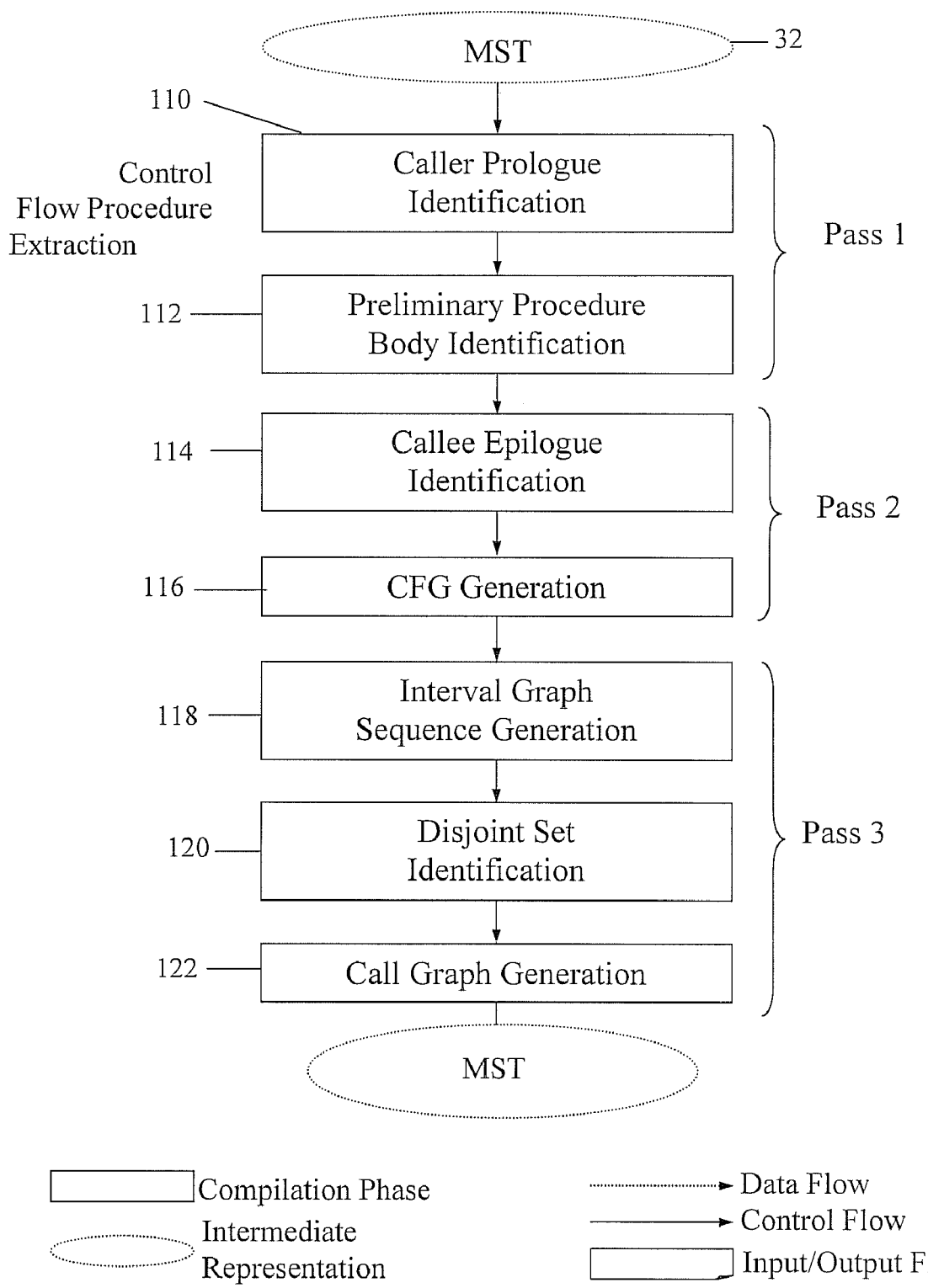
FIG. 6 illustrates the control flow for Procedure Extraction phase of the MST.

FIG. 6 shows the sequence of steps used to extract the procedure bodies in block 34 (FIG. 2). The first pass includes a Caller Prologue Identification step 110 and a Preliminary Procedure Body Identification step 112. In the first pass, a list of the all the discernible 'called' functions is generated using caller prologues. In this method, a function is discernible if the call instruction clearly denotes the first instruction within the function body, e.g. jump to a label or an immediate address. In such a case, the destination of the call can be marked as the beginning of a function. In some cases, if the destination is stored within a register or a memory location, its position within the instruction list is not clear. This is most often the case when function pointers are passed as arguments to other functions. Caller prologues are also used to identify the return addresses.

The second pass includes a Callee Epilogue Identification step 114 and a CFG generation step 116. The second pass is used to identify function bodies and remove erroneous function prologues. It is assumed that the function bodies are not scattered as fragments within the binary. Callee epilogues are used to recognize functions returns. The second pass looks for all possible return instructions, callee epilogues, within a function body. If none is found and the body of another discerned function is impinged, then it is assumed that the impinged function was identified erroneously. Its body is merged with the function that was being processed. This leads to the pruning of the function list. The function returns are changed to jumps to a new label, a control sink, attached to the end of the instruction list. This is done to help the interval analysis in the third pass. It is possible to have multiple unrecognized functions present in the instruction lists generated by the second pass. The third and last pass tries to weed these out.

The third pass includes an Interval Graph Sequence step 118, a Disjoint Set Identification step 120 and a Call Graph Generation step 122. The third pass operates on the instruction lists generated by the two earlier passes. It generates a CFG for each instruction body and uses structural analysis to identify high-level structures like loops and conditionals. Within the CFG, the call instructions are not connected to their destination functions. Effectively these jumps are removed. Otherwise, the subsequent blocks would not have predecessors and cause a break in control flow. The method for the CDFG generation is described below.

Interval analysis is used to generate graph sequences. The presence of multiple nodes without ancestors in the last graph of the sequence, indicates the possibility of the presence of other functions. These separate functions would have only one common node, the exit or leaf node, because of the artificial jumps introduced in pass two. If that node is removed from the graph, along with its incident edges, then the different functions should constitute disjoint sets. The identification of such sets within the graph separates the function bodies.

Finally a function call graph is generated (block 122). This is used to identify procedures that can be moved to hardware. The list of return addresses is used to generate switch-case structures to mimic function returns. Alias analysis is used to determine possible destinations of branch instructions bearing dynamic destinations.

The Control and Data Flow Graph (CDFG) is generated from the MST. A Control Flow Graph represents the flow of control in a design, while a Data Flow Graph represents the flow of data. Using the write-back times (wb=timestep+delay) for each operation, one may calculate the data dependencies in each MST instruction. The Control Flow Graph described above, along with the Data Flow Graph that is generated by the MST instructions, form the Control and Data Flow Graph (CDFG). Together they represent both the data dependencies and the flow of control for each MST Procedure. The nodes in the CDFG are distinguished in five different types: Constants, Variables, Values, Control, and Memory. Constant and Variable nodes are inputs to operations. Value nodes are operation nodes, such as addition and multiplication. Control nodes represent branch conditions in the control flow. Memory nodes refer to memory read and write operations.

Memory read and write operations are represented in the CDFG as single node operations with two input edges from source nodes. The source nodes for a read operation consist of an address and a memory node, while the source nodes for a write operation consist of an address and the value to be written. In order to prevent memory hazards, additional edges are added from each the previous read and write operations to the subsequent memory operation. These extra edges ensure that no two memory operations occur in the same cycle.

Predicated operations are handled by adding the predicate operand as a source node to the operation node in the CDFG. Additionally, an edge from the previous definition of the destination node is also added as a source node. The result is an if-then-else statement, which assigns the previous definition to the destination operand if the predicate condition is not met.

Figure 7:
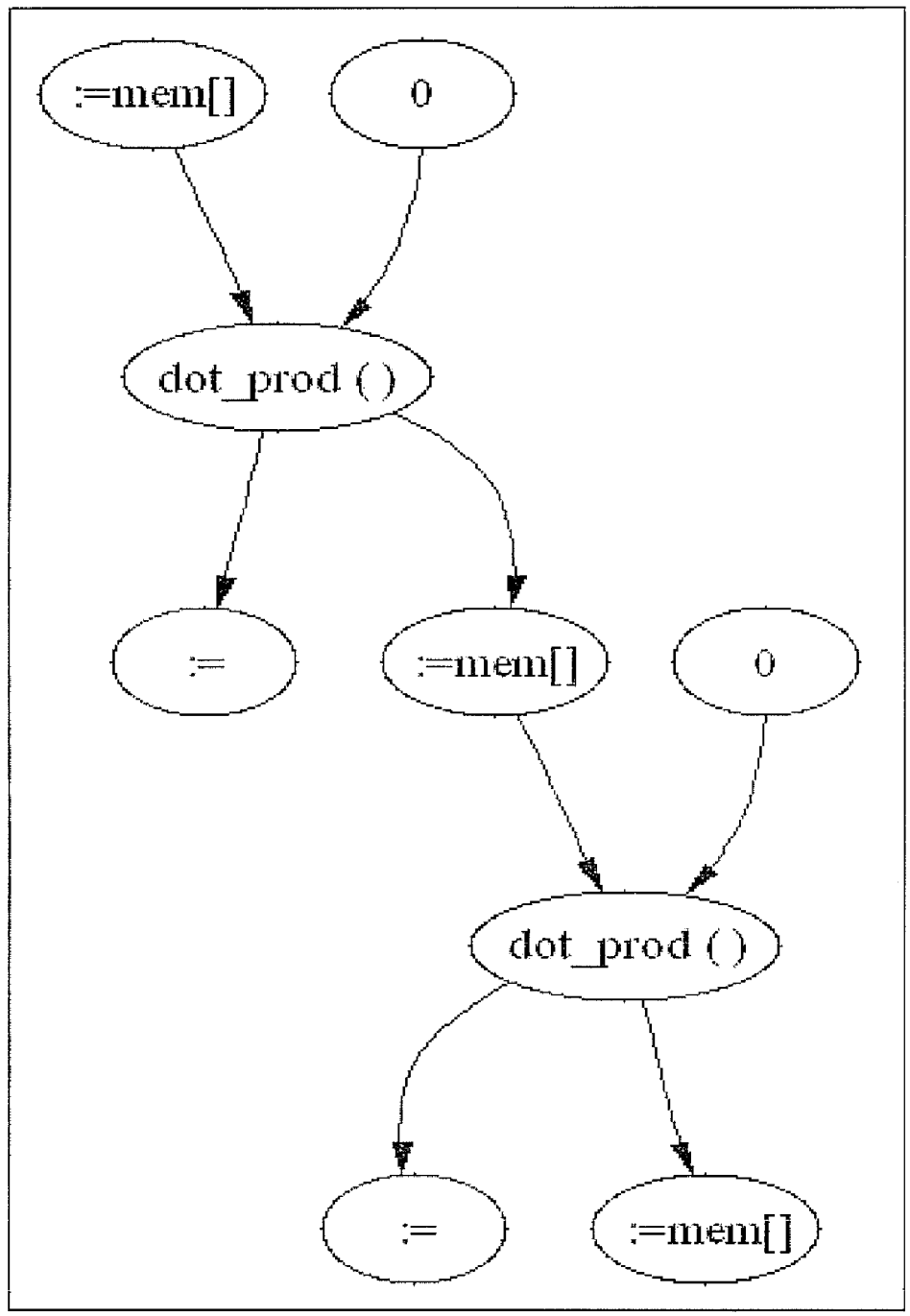
FIG. 7 is a CDGF representation of a call operation.

Procedure, Function and Library calls are handled in the CDFG by node representation. The input and output edges to a CALL node represent the I/O ports for the procedure. Memory operands are set up as both input and output nodes in order to prevent multiple procedures from accessing the same memory in parallel. Dependencies are then generated by adding consecutive edges between the memory operand and its uses. FIG. 7 shows a CDFG for a procedure that calls the Dot Product procedure twice. A memory dependency exists between the two procedure calls, preventing the two functions from causing read/write hazards by running in parallel.

Figure 9:
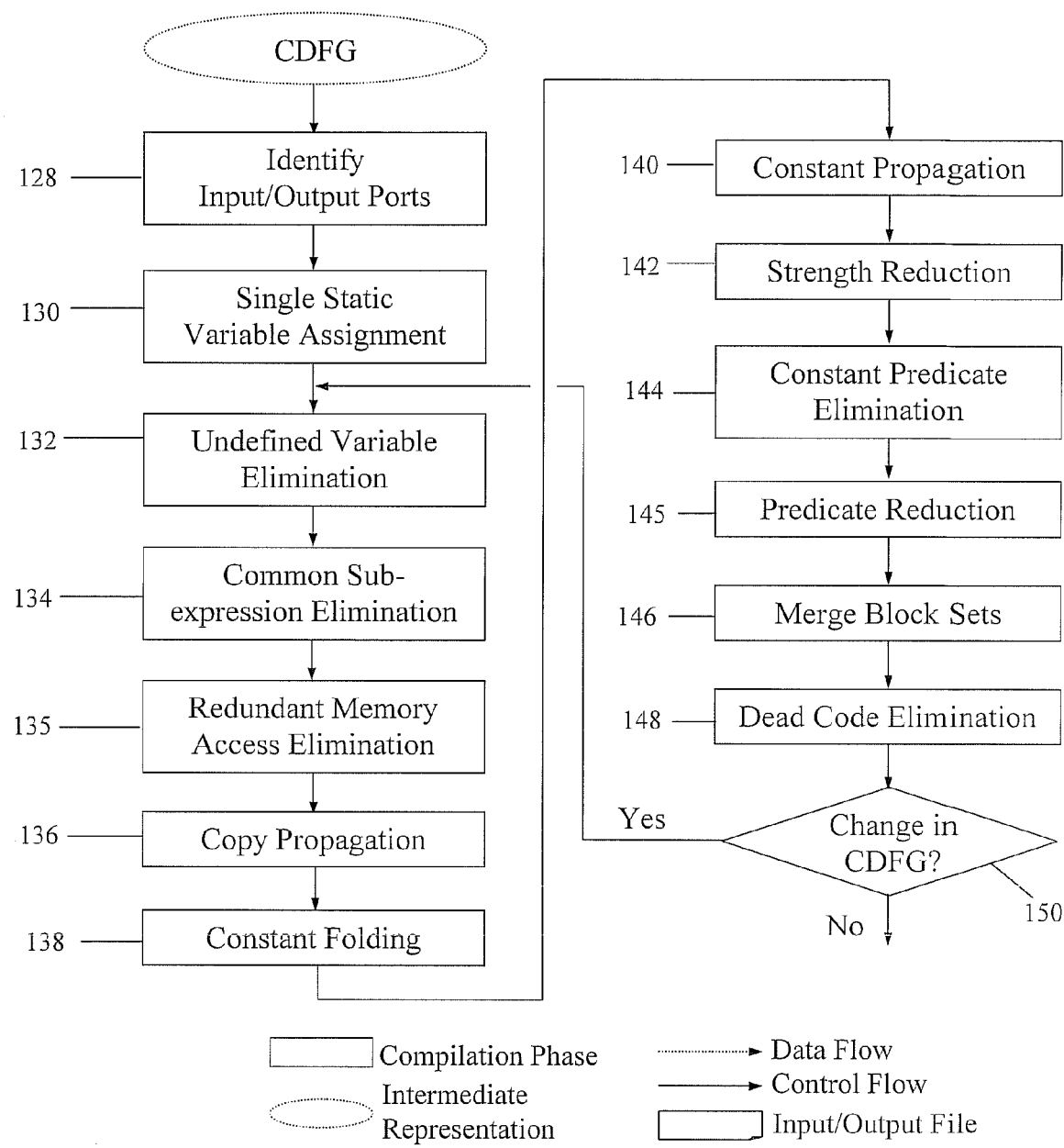
FIG. 9 illustrates the control flow for the CDFG generation and optimization phases.

FIG. 9 illustrates the passes used for CDFG construction and optimizations, following CDGF generation by the MST in the Flow graph Generation block and the Data Flow Graph Generation block which correspond to respective blocks 116 and 122 in FIG. 6. Several traditional optimizations have been implemented on the CDFG. See, for example, *Advanced Compiler Design Implementation*, 1997, by Steven S. Muchnick; Morgan Kaufmann, San Francisco, Calif. These optimizations serve to reduce the design area and power consumption, while increasing the frequency of the design. The compiler runs these optimizations repeatedly until the design becomes stable. Most of the optimizations utilize Structural Analysis and Reaching Definitions. The optimizations can include the identification of input/output ports 128, static-single variable assignment 130, undefined variable elimination 132, common sub-expression elimination 134, redundant memory access elimination 135, copy propagation 136, constant folding 138, constant propagation 140, strength reduction 142, constant predicate elimination 144, predicate reduction 145, merging block sets 146 and dead-code elimination 148. Decision block 150 determines if any change has been made in the CDFG and if so, returns the flow back to block 132 to again traverse the loop including blocks 132-148.

It is obvious that without optimizations, the performance of an FPGA or ASIC would be much worse than that of a general-purpose processor. The compiler in accordance with the present invention utilizes various methodologies and compiler optimizations in order to exploit the inherent parallelism of the FPGA or an ASIC. The novelty of the application of some of these approaches lies in their adaptation to fit the binary-to-hardware context. A key step in applying some of these optimizations is the recognition of high-level language constructs, such as loops and arrays. Structural Analysis is applied to the CDFG for the recognition of high-level language constructs, such as loops and conditionals. This technique has been used in the past for decompilation. In the present invention, it is combined with other optimizations like unrolling and scheduling for the purpose of improving the quality of hardware designs.

Figure 10:
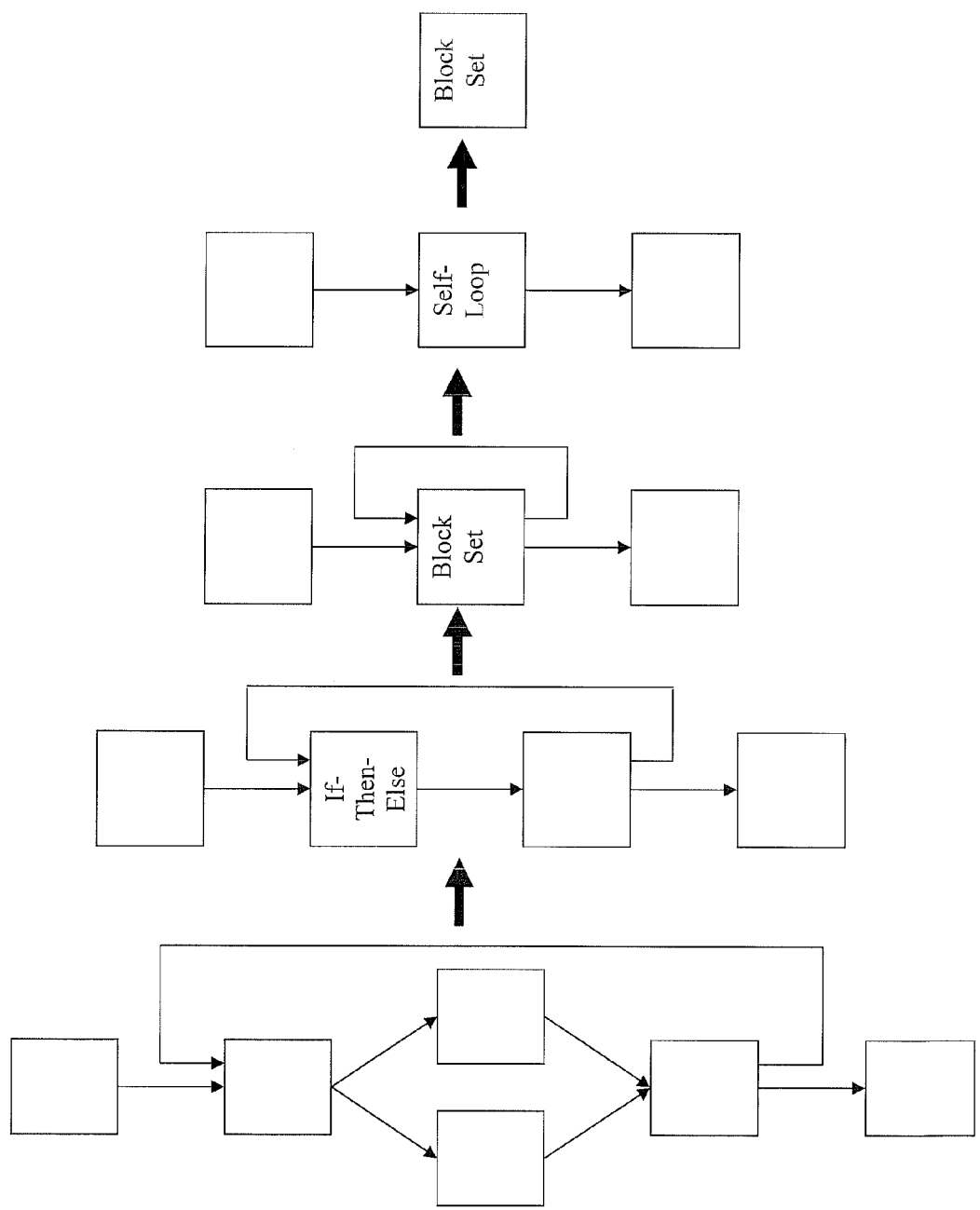
FIG. 10 illustrates a structural analysis on a given CFG.

Structural Analysis is a method of determining high-level constructs such as loops and if-then-else bodies within a CFG. Structural Analysis is generally performed using the graph minimization technique. FIG. 10 shows the graph minimization technique performed on a CFG. The first iteration minimizes an if-then-else construct. The second iteration reduces the if-then-else structure and the succeeding block into a block set. A self-loop is identified in the third iteration. Finally, the fourth iteration minimizes the graph into block set.

Reaching Definitions is a method of data flow analysis. Four bit vectors, PRSV(i), GEN(i), RCHin(i) and RCHout(i), are generated to represent each definition in the entire CDFG, where each operation node holds an individual position in each vector. The PRSV(i) vector represents the definitions that are preserved by block i. The GEN(i) vector represents the definitions which are killed in block i. We may then define the bit vectors RCHin(i) and RCHout(i) which represent definitions that reach the beginning and end of block i, respectively. A definition is said to reach the beginning of a block i if that definition reaches the end of all blocks preceding i. A definition is said to reach the end of block i if it either occurs in block i and the variable it defines is not redefined in i, or it may reach the beginning of i and is preserved by i. The RCHout(i) vector is thus defined as: RCHout(i)=GEN(i) V (RCHin(i) ˆ PRSV(i)) for all i. In order to solve the system of bit vector equations, the equations are iterated until no further changes result. The final system of equations is used to generate Definition-Use (DU) chains and Use-Definition (UD) chains. The former maps a definition to all it uses in the CDFG, while the latter maps a use of a variable to all of its definitions in the CDFG.

With reference to FIG. 9, the CDFG construction and optimizations set forth in blocks 128-148 are now described in more detail. I/O ports, block 128, are identified immediately after generating a CDFG. Using Reaching Definitions, one may determine INPUT, OUTPUT and INOUT ports using the DU-chains and UD-chains. An INPUT port is defined as a node that is used, but has no prior definition. An OUTPUT port is defined as a node that has a definition but no subsequent uses. An INOUT port is a variable that has been defined as both an INPUT and OUTPUT port. However, we rely on Single Static-Variable Assignment (SSA) to prevent INOUT port types because they are generally not supported by back-end synthesis tools.

Single Static-Variable Assignment (SSA), block 130, is a method of breaking data dependencies by ensuring that every assignment in the CDFG has a unique variable name. SSA form is invaluable, as it simplifies the DU-chains and UD-chains, allowing for more effective optimizations. Traditionally, the Φ-function is used in the beginning of blocks as a join point to sort out multiple assignments to a variable. The number of arguments to the Φ-function is equal to the number of definitions of the variable from each point in the control flow. When converting to hardware, this method causes a significant bottleneck by adding numerous instructions to select which definition propagates based on the control flow. As an alternative to this method, in each block in the CDFG we assign the latest definition of each SSA variable back to it's corresponding variable name. Assuming a linearized MST and correct Reaching Definitions, we can be assured that only the latest definition of a variable will reach the end of a block, and therefore only that SSA variable should propagate to the successive blocks in the CDFG. We rely on optimizations such as Copy Propagation (block 136) and Dead-Code Elimination (block 148) to remove extraneous assignment operations created by this method.

Undefined Variable Elimination, block 132, assigns a value of zero to a variable that is not an INPUT port and is used without having been defined. This optimization is valid because in hardware an undefined variable would have been reset to zero or left at high-impedance, producing erroneous results. This optimization allows optimizations such as Constant Folding (block 138) and Constant Propagation (block 140) to work more efficiently in reducing the CDFG.

Common Sub-expression Elimination, block 134, is an optimization that removes redundant operations, and replaces them with saved values. An operation is said to be a common sub-expression if it is preceded by another instruction containing the same expression and the operands remain unchanged between the two evaluations. This optimization is implemented locally in each block by hash-defining a string representation for each instruction. Multiple hash strings are generated for commutative operations. The operator node is then stored in a map using the hash-string as the key. If a subsequent operation produces the same hash key, the operation is replaced by an assignment from the previously mapped node. We may then rely on optimizations such as Copy Propagation to reduce the CDFG even further. FIG. 11 shows an example of Common Sub-expression Elimination, where the expression assign to e is evaluated and replaced by an assignment from the value c.

Redundant Memory Access Elimination, block 135, is an expansion of Common Sub-expression Elimination. This optimization produces significant results, as it removes the effects of memory spilling and redundant memory operations that often occur after unrolling a loop. This optimization uses hash-defined strings to represent memory addresses for determining redundant memory operations. A memory operation is said to be redundant and may be reduced if any of the following occur: If two consecutive memory read operations access the same address, the second memory read operation is eliminated and the result of the first memory read operation is forwarded; If two consecutive memory write operations access the same address, the first memory write operation is eliminated; If a memory read operation immediately follows a memory write operation in which both access the same address, the memory read operation is eliminated and the value written to memory is forwarded.

Copy Propagation, block 136, is a transformation that given an assignment of variables x←y, replaces later uses of x with y, as long as the intervening instructions have not changed the value of either x or y. However, if x is a predicated assignment operation, one may not propagate the value y to any later uses of x because the result is said to be indeterminate. FIG. 12 shows an example of Copy Propagation, where subsequent uses of a are replaced by b.

Constant Folding, block 138, is an optimization that solves for operations on constant values at compile time. It replaces expressions consisting of operations on known constant values with their resultant values. It affects a reduction in extraneous computations and area. We may then rely on Constant Propagation to further reduce the CDFG.

Constant Propagation, block 140, is similar to Copy Propagation, in that given an assignment x←c for a variable x and a constant c, the optimization replaces later uses of x with c, as long as the intervening instructions have not changed the value of x. However, if x is a predicated assignment operation, one may not propagate the value c to any later uses of x because the result is said to be indeterminate.

Strength Reduction, block 142, is an optimization that replaces operations that are costly in terms of area, power or cycle time with less expensive ones. For instance, multiplication by a factor of two may be replaced by a shift operation. Unnecessary operations are also replaced, thus Constant Folding is inherently an aspect of Strength Reduction.

Constant Predicate Elimination, block 144, solves for predicated operations whose predicate operand is determined to be a constant value at compile time. This may occur after such optimizations, such as constant propagation, constant folding, or strength reduction. If the constant predicate condition is met, the predicate is removed from the operation node. Otherwise, if the constant predicate condition is not met, the operation is replaced with an assignment from the destination operand's previous definition. The result of this optimization leads to a reduction in the number of multiplexers implemented in a hardware design, saving the cost of area and critical path. Additionally, it allows other optimizations to function more efficiently in reducing the CDFG. In the example in FIG. 13, the first predicated operation is evaluated to be true, so the predicate is removed. However, the second predicated operation is evaluated to be false, and therefore we assign the previous definition of the destination register c to itself.

Figure 17:
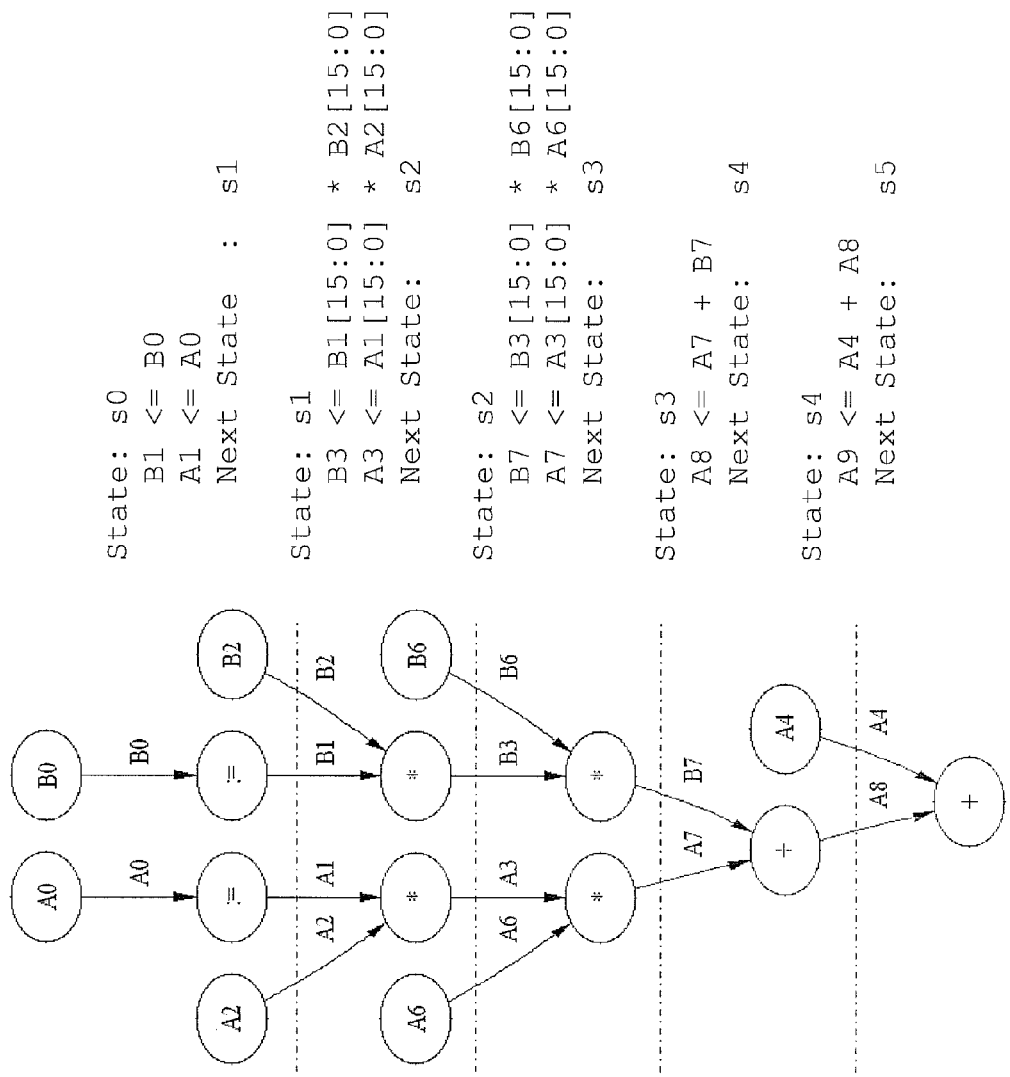
FIG. 17 shows CDFG and HDL representation of ASAP scheduling for the processor assembly code shown in FIG. 16.

Predicate Reduction, block 145, is an optimization that reduces multiple sequences of conditional set operations, which are generally used as predicates for other operations. The result of this optimization leads to a reduction in the number of multiplexers implemented in a hardware design, saving the cost of area and critical path. In FIG. 17, the sequence of set instructions on the left side is reduced to the set instruction on the right side.

Merging Block Sets, block 146, is an optimization that merges the nodes in a set of consecutive blocks, where the first block is the only predecessor to the second block, and the second block is the only successor to the first block. The result produces more efficient scheduling techniques, allowing for more parallelism in a design.

Dead-Code Elimination, block 148, utilizes DU-chains in order to remove nodes that have no subsequent uses and are not OUTPUT ports. The result of this optimization is an elimination of extraneous operations that have no effect on the rest of the design.

Referring again to FIG. 2, array separation, block 44, includes array access recognition and dependency removal. It combines memory aliasing and the recognition of idiomatic indexed expressions. This novel combination recognizes the use of contiguous memory locations accessed using indexed expressions (or arrays). The purpose of array separation is to break dependencies between different arrays and allow them to be mapped to separate memory arrays. The usefulness of the approach lies in the context, i.e., generation of custom hardware. Arrays accesses frequently occur within loops. Unrolling such loops generates large blocks with numerous array accesses. The method of array recognition and separation according to the present invention, allows the removal of false dependencies among these arrays. It also allows the incorporation of multiple memory arrays to provide a significant performance benefit.

Compiling the machine-level syntax tree representation into a Control and Data Flow Graph (CDFG) representation can include analyzing the control flow of the CDFG representation of the program such as loops; and unrolling the loops to exploit parallelism, block 46, FIG. 2.

Figure 15:
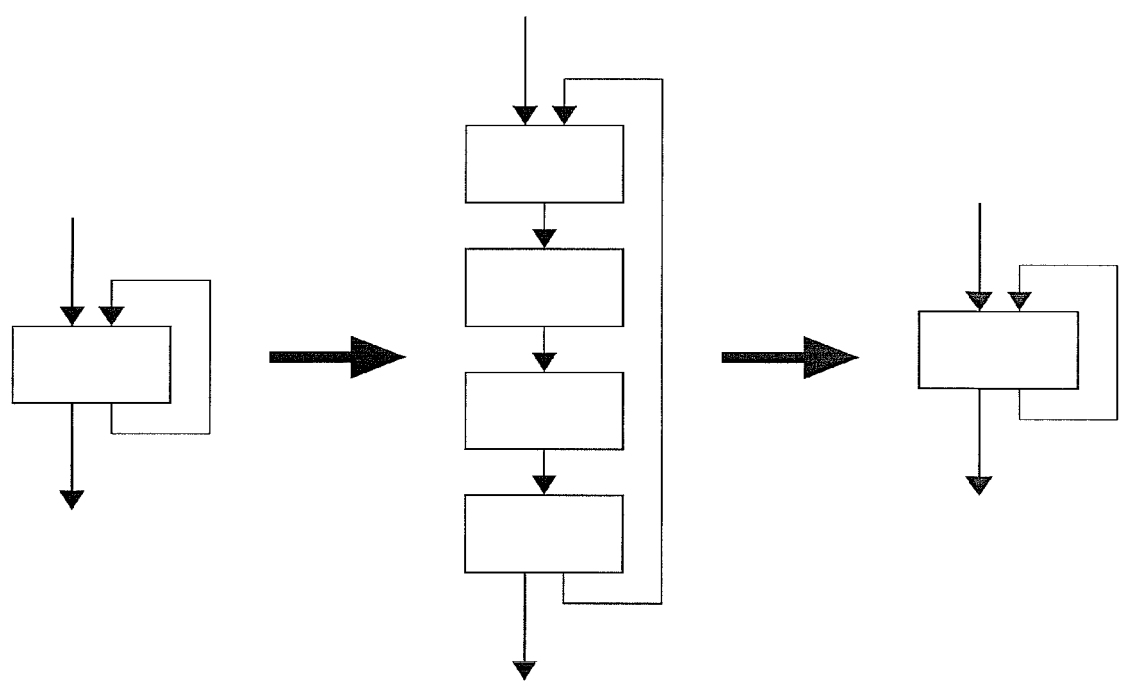
FIG. 15 illustrates the use of loop unrolling on CDFG basic blocks.

The unrolling optimization helps exploit on chip parallelism and decreasing clock cycles in a design by unrolling blocks of code in order to allow more instructions to be scheduled in parallel. For example, unrolling a loop four times will produce four times as many operators to schedule in a given time step. A benefit of migrating applications from a general-purpose processor onto an FPGA or ASIC is in exploiting the on-chip parallelism. For example, the Virtex II Pro XC2VP125 processor, produced by Xilinx Corporation, has 556 embedded multipliers that can potentially exploit 556-way parallelism in each clock cycle. Hence, one needs to explore the fine grain parallelism that is inherent in the CDFG through data scheduling. The Loop Unrolling optimization requires Structural Analysis to be performed initially in order to identify loop constructs in the design. Loop unrolling is performed by attaching successive copies of the CDFG basic blocks (and their nodes) within a loop body. The CDFG Optimizations are run again after loop unrolling. We rely on the Merge Block Set optimization to join block sets that may be merged, and the other optimizations to reduce the CDFG even further. FIG. 15 shows a self-loop structure in the CDFG (left), which is unrolled four times (center). The Merge Block Set optimization joins the block sequences by merging the nodes of all four basic blocks (right).

Referring to FIG. 2, the scheduling and binding pass, block 48, performs behavioral synthesis on the CDFG representation by scheduling the computations of nodes in each basic block in the data flow graph onto various resources (adders, multipliers, etc.) in different states within a finite state machine, in a manner known in the art. See, for example, G. DeMicheli, Synthesis and Optimization of Digital Circuits, McGraw Hill, 1994. Benefits of scheduling include reduced delay through increased parallelism. The delay and resource availability is used to schedule as many operations in parallel as possible. The type and quantity of each of these architectural resources are described using the Architecture Description Language (ADL) of the target FPGA. The high-level synthesis algorithms handle multi-cycle operators during scheduling, as well as multi-cycle memory read and write operations.

Analyzing the control flow of the CDFG representation of the program and scheduling the nodes of the CDFG onto cycles and resources can be carried out using As Soon As Possible (ASAP) or As Late As Possible (ALAP) or other scheduling and various operator chaining algorithms.

Several simple scheduling algorithms can be used, including unconstrained and constrained versions of As Soon As Possible (ASAP) and As Late As Possible (ALAP) scheduling, software pipelining, modulo scheduling and hyper-block scheduling. Using ALU operation chaining, one is able to schedule many more simple operations per state, mainly those that do not affect the frequency of the design. Multiplication, memory writes and predicated instructions are among those that are not chained. FIG. 16 shows a small piece of TI C6000 DSP Processor assembly code. FIG. 17 shows the CDFG and HDL representation for the assembly code of FIG. 16 after using ASAP scheduling.

Figure 18:
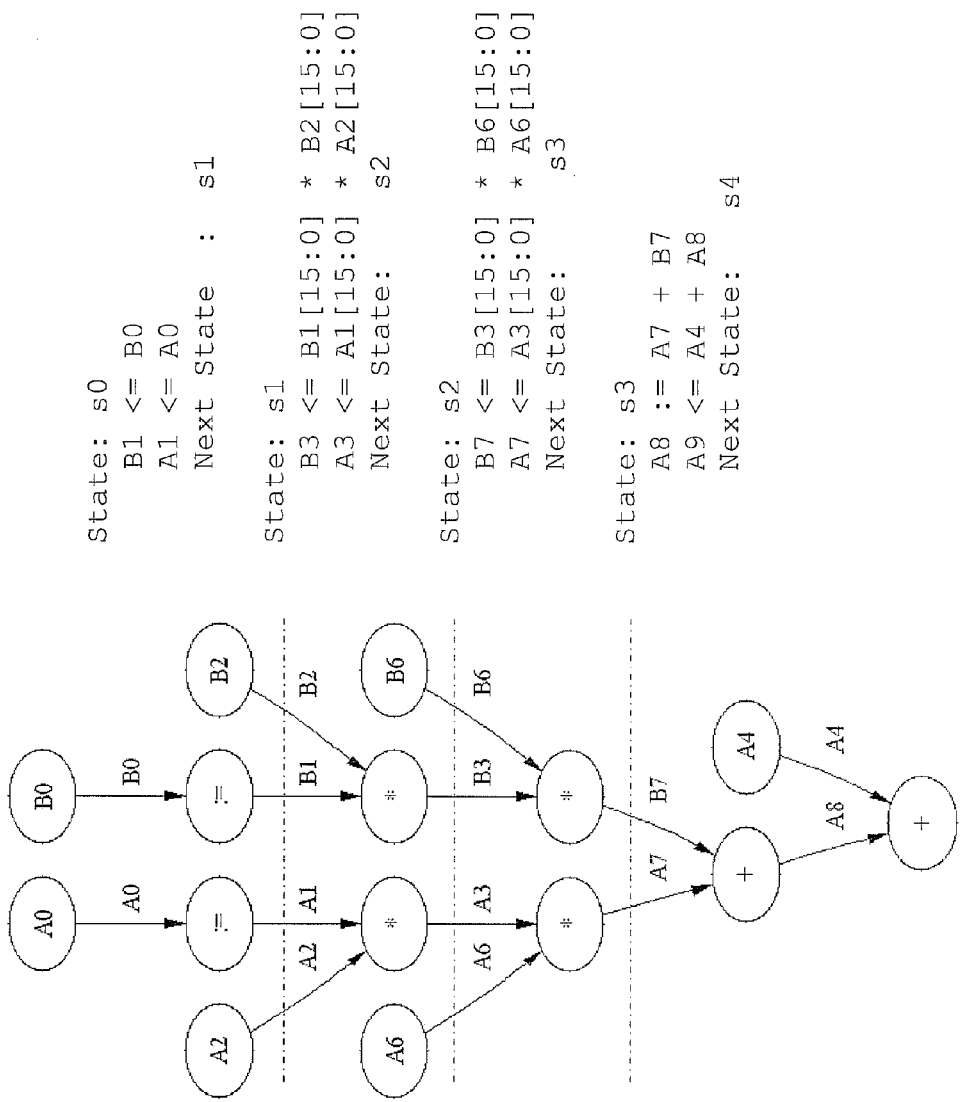
FIG. 18 shows CDFG and HDL representation of ASAP scheduling with simple chaining for the processor assembly code shown in FIG. 16.

The chaining optimization can be demonstrated with the following three differing approaches: simple chaining, complex chaining, and unconstrained chaining. In the simple chaining approach, only simple ALU (Value type) operations are chained. These include, but are not limited to logical operations, conditional set operations, addition, and subtraction. Complex structures, such as multiplication, are isolated in separate states so as to reduce the critical path. FIG. 18 shows the CDFG and corresponding HDL representation of the assembly code shown in FIG. 16 with simple chaining applied before ASAP scheduling. The first set of assignment operations are assigned to the first state; the two sets of multiplication operations are isolated in the second and third states; the last two addition operations are chained together in the fourth state. The resulting design takes four cycles to complete, as shown in the HDL representation.

Figure 19:
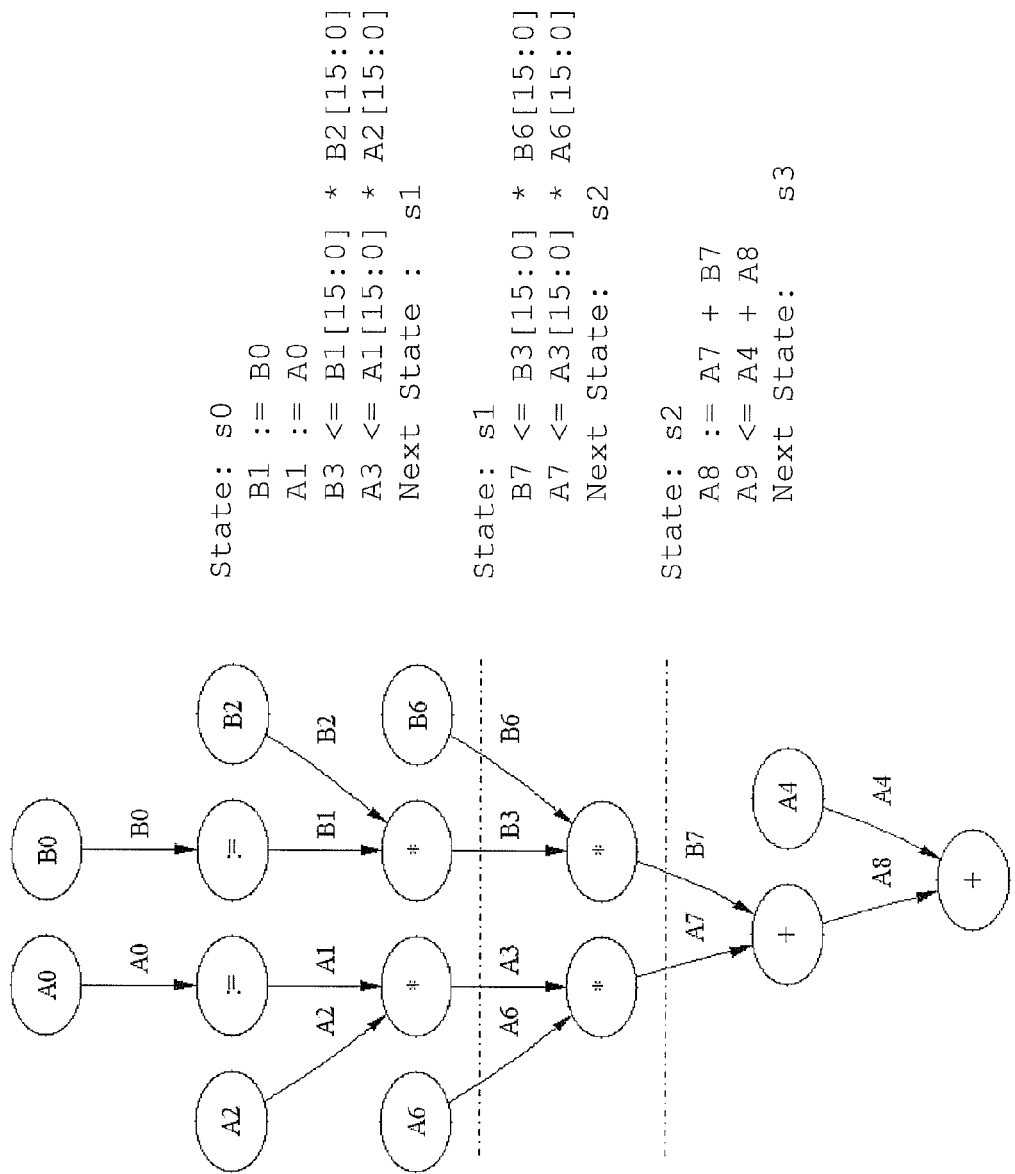
FIG. 19 shows CDFG and HDL representation of ASAP scheduling with complex chaining for the processor assembly code shown in FIG. 16.

In complex chaining, operations up to and including a single complex structure are chained. When considering DSP applications, it is more common to find sequences of multiply-accumulate operations than accumulate-multiply sequences. Consequently, one would expect this approach to produce larger critical paths if multipliers were chained with successive nodes rather than preceding nodes. FIG. 19 shows the CDFG and corresponding HDL representation of the assembly code shown in FIG. 16 with complex chaining applied before ASAP scheduling. The first set of assignment and multiplication operations are chained together in the first state; the second set of multiplication operations is isolated in the second state; the last set of addition operations are chained together in the third state. The resulting design takes three cycles to complete, as shown in the HDL representation.

Figure 20:
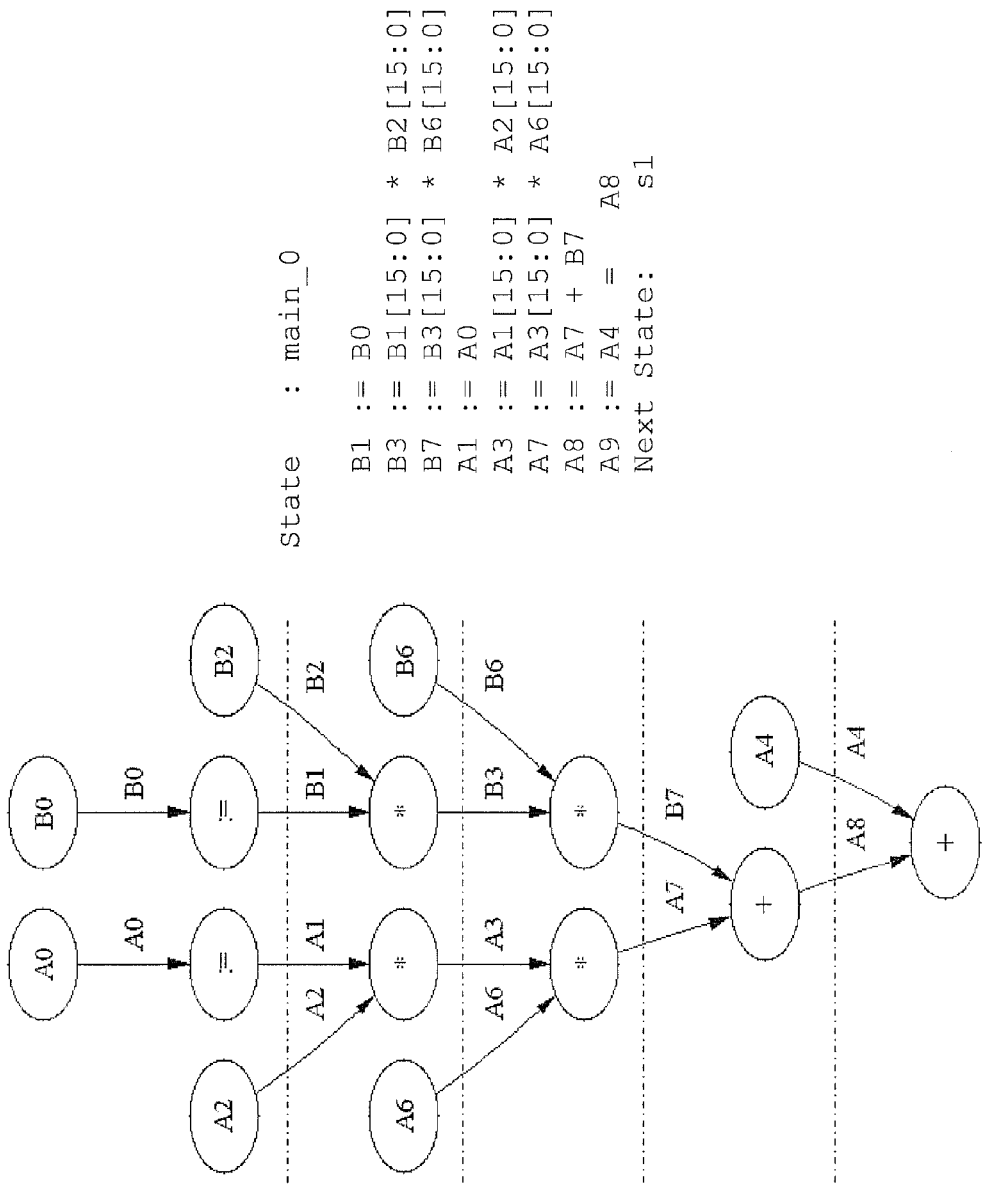
FIG. 20 shows CDFG and HDL representation of ASAP scheduling with unconstraint chaining for the processor assembly code shown in FIG. 16.

In unconstrained chaining, all operations may be chained. FIG. 20 shows the CDFG and corresponding HDL representation of the assembly code shown in FIG. 16 with unconstraint chaining applied before ASAP scheduling. All operations are chained together in a single state, and the resulting design takes only a single cycle to complete. However, in this design, even though the number of clock cycles is reduced to 1, the critical path delay requires five operations. Consequently, the clock frequency of the design will be much lower than the design without chaining.

Referring again to FIG. 2, register allocation 50 is an optimization that is performed after scheduling to reduce the number of registers. Reducing registers in circuit designs generally leads to smaller design size. Unlike DSP processor architectures, FPGAs are not limited to a small, fixed number of registers. Since they are capable of handling significantly more registers, one does not need to be concerned with issues such as memory spilling. However, one must realize that the scheduling of operations affect the number of possible register reuses.

Register allocation was implemented for the compiler using the Linear-Scan (left-edge) algorithm. We assume the nodes in the CDFG are in SSA form, in which data dependencies are broken. We also assume an unbound number of register resources in the target FPGA, and our task is to assign the variable lifetimes to the smallest subset of registers. Structural analysis is performed beforehand to identify loops and other constructs. Prior to running the Linear-Scan algorithm, one must determine the liveness of each variable, or the time from the variable's first definition until its last use. This information is obtained from the nodes in the CDFG after scheduling.

Our approach for calculating the live intervals of registers in a CDFG is as follows. The nodes in each basic block are sorted in depth-first order. We then iterate through the nodes in each basic block and map a list of nodes sharing the same name along with a time interval to the name in a register table. Each node that is encountered is added to the table under its corresponding name. The lifetime interval is updated by comparing the current start time with the node's timestamp, and comparing the current end time with the timestamp of all successive uses of the node. If a node is a Variable type and exists inside a loop, the time interval is extended to the loop body's time boundaries. The register table is used in the Linear-Scan algorithm by renaming the list of nodes in each mapping with a newly allocated register name. We use a simple approach that does not make use of lifetime holes or necessitate memory spilling. The algorithm runs in $O(V)$ time, where V is the total number of nodes in the CDFG.

When compiling high-level language programs onto a general-purpose processor, global variables are generally mapped onto the data memory and local variables are placed on the stack. The limited size of the register file often requires that variables be spilled to the memory, thus generating numerous memory accesses. When such codes are translated into RTL VHDL or Verilog, it severely limits the performance on the FPGA or ASIC since the FPGA/ASIC is capable of supporting an extensive number of registers far beyond the scope of a general purpose processor. Furthermore, when this code is unrolled, successive iterations of a loop must wait for the preceding memory writes to complete before performing their operations. Other limitations are apparent when loop indices are placed on the stack. These problems can be resolved through alias analysis and partitioning data across different memories.

A simple aliasing technique has been devised for the stack and memory. It requires that any memory access have addresses of the type *B[x*REG+y], where B is the base address, REG is a register, and x and y are numeric constants. Two address expressions refer to the same location if x, y and REG are identical. The simplicity of the technique relies on the fact that memory addresses are usually modified by immediate values only. Within a loop, the array base would remain the same while the offset would change based on the loop index, represented by REG. It is aided by induction analysis, by removing some of the register name dependence.

For a simple 2 D-array, stored in the row-major form A[I,J], the address expression will be of the form "x*I+J+y". Here, x is the row length and y the base. The arrays can be distinguished from one another by the difference in their bases. Data on array sizes and offsets can be used for this purpose when convenient. Also, user input of minimum array sizes can be used effectively in some cases. The occurrence of address expressions within loops and the presence of loop iterators within the expressions are indicators to the presence of arrays.

General-purpose processors have a limited number of memory ports for supporting memory loads and stores. Also, they have a small number of functional units that can operate in parallel. The advantage of mapping applications to FPGAs or ASICs is that the parallelism in a computation can be exploited by using a large number of multipliers in parallel. However, requires a mechanism to feed the data to the functional units, such as adders and multipliers. The data can be stored in registers or embedded RAMs.

Mapping all variables to registers allows accessing all the data in parallel. However, the results of these registers have to be distributed through large multiplexers to various functional units. This can increase the amount of area required by a design. However, mapping all these variables onto embedded RAMs can reduce the cost of the multiplexers on the FPGAs, but at the cost of reduced memory bandwidth. The compiler provided by the present invention uses a simple heuristic in that all scalar variables are mapped to registers, and all array variables that are greater than 128 bytes are mapped to embedded memories. By using the embedded block RAMs on the FPGA or ASIC, it is therefore possible to support larger data bandwidths through parallel memory access.

The optimized CDFG is translated into another intermediate abstract syntax tree, analogous to a high-level Hardware Description Language (HDL) 60. The Hardware Description Language (HDL) is an intermediate low-level language, which models processes, concurrency, and finite state machines. Each CDFG in a design is mapped to an individual HDL Entity. In its simplest form, each CDFG operation node is assigned to an individual state in an HDL finite state machine. However, by performing scheduling techniques, one may exploit the parallelism the design by increasing the number of instructions assigned to each state, thereby reducing the total number of execution cycles in the design. Additional optimizations and customizations 62 are performed on the HDL to enhance the efficiency of the output and to correctly support the target device's architecture. The complete HDL is translated directly to RTL VHDL and Verilog to be mapped onto FPGAs. Architecture-specific information is acquired via the Architecture Description Language (ADL) files 54. This includes data pertaining to resource availability, signal names, etc.

Compiling the CDFG representation into a hardware description language (HDL) state machine 60 (FIG. 2) includes determining the presence of any addressable variables in the assembly program and mapping any addressable variables onto at least one of addressable hardware memory and an addressable array of hardware registers formed in HDL.

Towards this effort, the compiler according to the present invention generates RTL VHDL and Verilog codes that allow backend synthesis tools to automatically infer both synchronous and asynchronous RAMs. Memory pipelining is used to improve the throughput performance. Through alias analysis, data can be automatically partitioned into different memories, thus increasing the number of memory access per state and the parallelism in the design.

Each CDFG in a design represents an individual procedure. When translated to HDL, a procedure is expressed as a concurrent process within an Entity model. FIG. 21(*a*) shows the HDL for an instantiation of the Dot Product process. The process is controlled by I/O signals, as illustrated in FIG. 21(*b*); it is initialized when the reset is set high in the first state, and cycles in the second state until the function concludes by setting the interrupt signal high.

In order to prevent memory contention, an asynchronous process is set up as a multiplexer to distribute memory control between processes. The memory control is enabled by assigning a select value to the mem_mux_ctrl signal just before a process begins. The HDL model for the Memory MUX process is illustrated in FIG. 22.

The complete HDL is translated directly to RTL VHDL 68 and RTL Verilog 70 to be mapped onto FPGAs and ASICs using commercial logic synthesis and physical design tools.

The compiler of the present invention automatically generates a testbench 72 in VHDL or Verilog to verify the correctness of the design in VHDL or Verilog. The testbenches 72 can be used to guarantee bit-true behavior in the synthesized hardware, compared to that of the original assembly or machine code versions. In order to verify the functionality of the VHDL/Verilog description generated by the compiler of the present invention, a mechanism is provided to compare the output of the hardware model with the assembly language model. This "verification engine" performs the following tasks: (1) sample the input and output data at appropriate clock cycles, capturing the input and output behavior of the hardware; this data can be written to a section of memory that can be dumped to a file later and, (2) correlate the sampled data with the corresponding values produced at the output ports in the assembly environment to verify the bit-accuracy of the HDL model. The goal of the testbench generator 72 is to streamline and automate the task of verifying that a circuit synthesized automatically by our behavioral synthesis tool subsequent backend synthesis tools retains the functionality of the original description.

Figure 23:
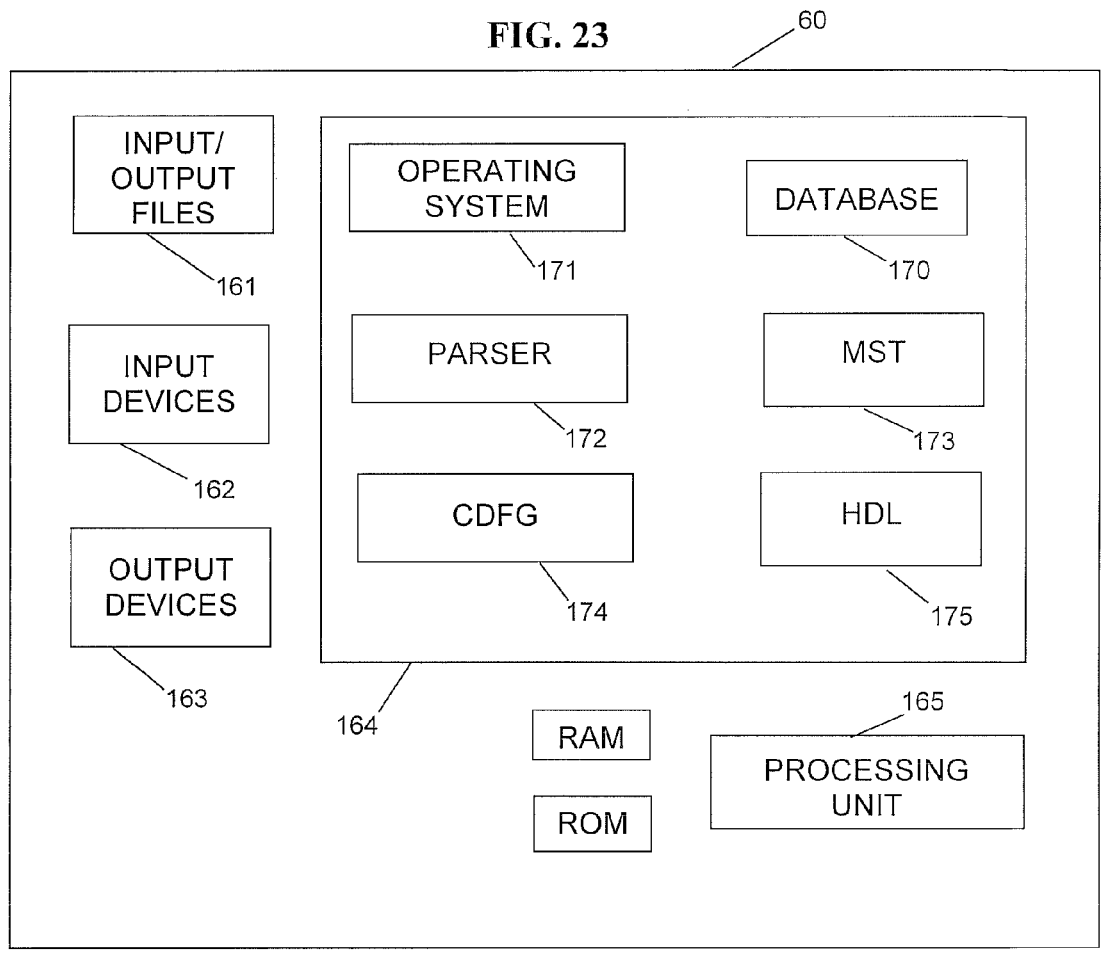
FIG. 23 is a block diagram of a processor for translating software binaries or assembly code to a hardware design in accordance with the present invention.

FIG. 23 is a block diagram of a processor 160 of a computer system for carrying out using the compiler to translate software binaries or assembly code to a hardware design in accordance with the present invention. Referring to FIG. 23, the computer system includes input/output files 161, such as the assembly Syntax and Semantic File, the DSP Assembly Code file, the RTL VHDL file, the RTL Verilog file and the Testbench file. The computer also includes input devices 162, such as a keyboard, CD and/or DVD drivers, output devices 163, such as a display device, a data structure 164 including storage devices, and a processing unit 165 having associated random access memory (RAM) and read-only memory (ROM). In one embodiment, the storage devices of the data structure 164 include a database 170 and software programs and files which are used in carrying out compiling operations in accordance with the invention. The programs and files of the computer system include an operating system 171, a parser engine 172, an MST engine 173, an CDFG engine 174 and an HDL engine 175. The programs and files of the computer system can also include or provide storage for data. The processor is connected through suitable input/output interfaces (not shown) to the input devices, the output devices, the storage devices, etc., as is known.

It may therefore be appreciated from the above detailed description of the preferred embodiment of the present invention that it provides a method and apparatus for translating software binaries and assembly code onto hardware.

Although an exemplary embodiment of the present invention has been shown and described with reference to particular embodiments and applications thereof, it will be apparent to those having ordinary skill in the art that a number of changes, modifications, or alterations to the invention as described herein may be made, none of which depart from the spirit or scope of the present invention. All such changes, modifications, and alterations should therefore be seen as being within the scope of the present invention.

What is claimed is:

1. A method for converting a software assembly program to a hardware design, said method comprising the steps of:
    creating a machine level syntax tree (MST) representation of the software assembly program in a given software binary program;
    compiling the MST representation into a Control and Data Flow Graph (CDFG) representation of the software assembly program by a processor controlled by an MST engine;
    compiling the CDFG representation of the software assembly program into a hardware description language (HDL) state machine;
    compiling the HDL state machine into a Register Transfer Level (RTL) VHDL or Verilog language; and
compiling the RTL VHDL or Verilog language onto a hardware representation onto one or more programmable circuit devices using a synthesis program and a physical design program.

2. The method according to claim 1, wherein the one programmable circuit device comprises a Field Programmable Gate Array (FPGA) or an Application Specific Integrated Circuit (ASIC).

3. The method of claim 1, wherein the software assembly program is programmed in an assembly language of a general purpose processor.

4. The method of claim 1, wherein the software binary program is a software binary machine code representation of instructions of a general purpose processor.

5. The method of claim 1, wherein the compiling of the CDFG representation into an HDL state machine includes the steps of determining presence of any addressable variables in the software assembly program; and mapping at least certain ones of the addressable variables onto at least one of addressable hardware memory and an addressable array of hardware registers formed in HDL.

6. The method of claim 1, wherein the compiling of the MST representation into a CDFG representation includes the steps of determining presence of function and procedure calls in the MST representation of the software assembly program; extracting procedure bodies; determining possible destinations of branches with dynamic destinations; generating a call graph; and mapping each of the function and procedure calls onto a separate HDL process.

7. The method of claim 1, wherein the compiling of the CDFG representation into an HDL state machine includes the steps of analyzing addresses of memory array accesses and pointer accesses in the software assembly program, and mapping the memory array and pointer accesses onto addressable registers in an HDL representation.

8. The method of claim 1, wherein the compiling of the CDFG representation into an HDL state machine includes the step of analyzing a control flow of the CDFG representation of the software assembly program and utilizing optimizations to exploit parallelism of the programmable circuit device.

9. The method of claim 1, wherein the compiling of the CDFG representation into an HDL state machine includes the steps of analyzing a control flow of the CDFG representation of the software assembly program, and scheduling nodes of the CDFG representation onto cycles and resources using a scheduling and operator chaining algorithm.

10. The method of claim 1, wherein the compiling of the CDFG representation into an HDL state machine includes the steps of analyzing a control flow of the CDFG representation of the software assembly program and scheduling nodes of the CDFG representation onto cycles and resources using an as soon as possible or as late as possible scheduling algorithm.

11. The method of claim 1, including automatically generating a test bench in VHDL or Verilog to verify correctness of the hardware design in VHDL or Verilog generated by a compiler.

12. The method of claim 1, including automatically generating a testbench to verify correctness of the hardware design by comparing an output of a hardware model with an assembly language model, including sampling input and output data at appropriate clock cycles to capture input and output behavior of the hardware model, writing the sampled input and output data to a section of memory, and correlating the sampled input and output data with corresponding values produced at output ports in an assembly environment to verify bit-accuracy of the hardware model.

13. The method of claim 1, wherein the creating of an MST representation of the software assembly program in a given software binary program includes performing optimizations on the MST representation prior to producing the CDFG representation, and wherein the compiling the CDFG representation of the software assembly program into HDL state machine includes performing optimizations on the CDFG representation prior to producing the HDL state machine.

14. The method of claim 13, wherein the performing optimizations includes using alias analysis to analyze memory accesses.

15. A computer-readable medium having computer-executable instructions for performing the steps recited in claim 1.

16. A method for converting a software program in a high-level language to a hardware design, said method comprising the steps of:
    compiling a high-level language program onto assembly or binary code of an embedded processor into an assembly language representation;
    compiling the assembly language representation into a machine level syntax tree (MST) representation in a given software binary program;
    compiling the MST representation into a Control and Data Flow Graph (CDFG) representation by a processor controlled by an MST engine;
    compiling the CDFG representation into a hardware description language (HDL) state machine;
    compiling the HDL state machine into a Register Transfer Level (RTL) VHDL or Verilog language; and
    compiling the RTL VHDL or Verilog language onto a hardware representation onto a Field Programmable Gate Array (FPGA) or an Application Specific Integrated Circuit (ASIC) using a synthesis program and a physical design program.

17. A method for deriving from a machine level syntax tree representation of a software assembly program a Register Transfer Level or Verilog language representation for use in producing a hardware design, said method comprising the steps of:
    compiling the machine-level syntax tree (MST) representation into a Control and Data Flow Graph (CDFG) representation of the software assembly program by a processor controlled by an MST engine, including performing optimizations on the MST representation prior to producing the CDFG representation, wherein the optimizations include analysis of data dependencies in scheduled assembly code by building a flow graph representation and by introducing virtual temporary registers;

compiling the CDFG representation of the software assembly program into a hardware description language (HDL) state machine, including performing optimizations on the CDFG representation prior to producing the HDL state machine wherein the optimizations include recognition of loops and arrays; and compiling the HDL state machine into a Register Transfer Level (RTL) VHDL or Verilog language.

18. A system for converting a software assembly program to a hardware design, said system comprising:

a processor; and a data structure including a parsing engine controlling the processor to create a machine level syntax tree (MST) representation of the software assembly program in a given software binary program;

an MST engine controlling the processor to create and to compile the MST representation into a Control and Data Flow Graph (CDFG) representation of the software assembly program;

a CDFG engine controlling the processor to compile the CDFG representation of the software assembly program into a hardware description language (HDL) state machine; and an HDL engine controlling the processor to compile the HDL state machine into a Register Transfer Level (RTL) VHDL or Verilog language and to compile the RTL VHDL or Verilog language onto a hardware representation on a programmable circuit device, wherein the HDL engine includes a synthesis program and a physical design program.

19. The system of claim 18, wherein the software assembly program is programmed in an assembly language of a general purpose processor.

20. The system of claim 18, wherein the software binary program is a software binary machine code representation of instructions of a general purpose processor.

21. The system of claim 18, wherein the CDFG engine controls the processor to perform the steps of determining presence of any addressable variables in the software assembly program; and mapping at least certain ones of the addressable variables onto at least one of addressable hardware memory and an addressable array of hardware registers formed in HDL.

22. The system of claim 18, wherein the MST engine controls the processor to perform the steps of determining presence of function and procedure calls in the MST representation of the software assembly program; and mapping each of the function and procedure calls onto a separate HDL process.

23. The system of claim 18, wherein the MST engine controls the processor to perform the steps of analyzing addresses of memory array accesses and pointer accesses in the software assembly program, and mapping the memory array and pointer accesses onto addressable registers in an HDL representation.

24. The system of claim 18, wherein the MST engine controls the processor to perform the steps of analyzing a control flow of the CDFG representation of the software assembly program, and utilizing optimizations to exploit parallelism of the programmable circuit device.

25. The system of claim 18, wherein the CDFG engine controls the processor to perform the steps of analyzing a control flow of the CDFG representation of the software assembly program, and scheduling nodes of the CDFG representation onto cycles and resources using a scheduling and operator chaining algorithm.

26. The system of claim 18, wherein the CDFG engine controls the processor to perform the steps of analyzing a control flow of the CDFG representation of the software assembly program and scheduling nodes of the CDFG representation onto cycles and resources using an as soon as possible or as late as possible scheduling algorithm.

27. The system of claim 18, wherein a compiler includes means for automatically generating a test bench in VHDL or Verilog to verify correctness of the hardware design in VHDL or Verilog generated by the compiler.

28. The system of claim 18, wherein a compiler includes means for automatically generating a testbench to verify correctness of the hardware design by comparing an output of a hardware model with an assembly language model, including sampling input and output data at appropriate clock cycles to capture input and output behavior of the hardware model, writing the sampled input and output data to a section of memory, and correlating the sampled input and output data with corresponding values produced at output ports in an assembly environment to verify bit-accuracy of the hardware model.

29. The system of claim 18, wherein in creating the MST representation of the software assembly program in a given software binary program the parsing engine performs optimizations on the MST representation prior to producing the CDFG representation, and wherein in compiling the CDFG representation into HDL state machine, the CDGF engine performs optimizations on the CDFG representation prior to producing the HDL state machine.

30. The system of claim 29, wherein the performing optimizations includes using alias analysis to analyze memory.

* * * * *